(12) United States Patent
Ono et al.

(10) Patent No.: US 11,476,336 B2
(45) Date of Patent: Oct. 18, 2022

(54) SEMICONDUCTOR DEVICE

(71) Applicants: KABUSHIKI KAISHA TOSHIBA, Minato-ku (JP); TOSHIBA ELECTRONIC DEVICES & STORAGE CORPORATION, Minato-ku (JP)

(72) Inventors: Hiroshi Ono, Setagaya (JP); Akira Mukai, Kawasaki (JP); Yosuke Kajiwara, Yokohama (JP); Daimotsu Kato, Kawasaki (JP); Aya Shindome, Yokohama (JP); Masahiko Kuraguchi, Yokohama (JP)

(73) Assignees: KABUSHIKI KAISHA TOSHIBA, Minato-ku (JP); TOSHIBA ELECTRONIC DEVICES & STORAGE CORPORATION, Minato-ku (JP)

( * ) Notice: Subject to any disclaimer, the term of this patent is extended or adjusted under 35 U.S.C. 154(b) by 0 days.

(21) Appl. No.: 16/787,351

(22) Filed: Feb. 11, 2020

(65) Prior Publication Data

US 2020/0335587 A1 Oct. 22, 2020

(30) Foreign Application Priority Data

Apr. 19, 2019 (JP) .............................. JP2019-080072

(51) Int. Cl.
*H01L 29/778* (2006.01)
*H01L 29/205* (2006.01)
(Continued)

(52) U.S. Cl.
CPC ............ *H01L 29/205* (2013.01); *H01L 23/29* (2013.01); *H01L 29/2003* (2013.01);
(Continued)

(58) Field of Classification Search
CPC ............ H01L 29/7783; H01L 29/7786; H01L 29/7787; H01L 29/7738
See application file for complete search history.

(56) References Cited

U.S. PATENT DOCUMENTS 7,709,859 B2 * 5/2010 Smith ................. H01L 29/7787
257/194
2011/0089468 A1 * 4/2011 Zhang ............... H01L 29/66462
257/194

(Continued)

FOREIGN PATENT DOCUMENTS

JP 2013-229486 11/2013
JP 2018-37600 A 3/2018
(Continued)

OTHER PUBLICATIONS

J. Park "Comparison of AlGaN/GaN High Electron Mobility Transistor with AlN or GaN as a cap layer" May 2011 Conference: E-MRS 2010 Spring Meeting with the paper uploaded to ResearchGate on Jul. 14, 2015 pp. 1-2 (Year: 2015).*

(Continued)

*Primary Examiner* — Grant S Withers
(74) *Attorney, Agent, or Firm* — Oblon, McClelland, Maier & Neustadt, L.L.P.

(57) ABSTRACT

According to one embodiment, a semiconductor device includes first, second and third electrodes, first and second semiconductor layers, and a first compound member. A position of the third electrode is between a position of the second electrode and a position of the first electrode. The first semiconductor layer includes first, second, third, fourth, and fifth partial regions. The fourth partial region is between the third and first partial regions. The fifth partial region is between the second and third partial regions. The second semiconductor layer includes first, second, and third semiconductor regions. The third semiconductor region is (Continued)

between the first partial region and the first electrode. The first compound member includes first compound portions between the third semiconductor region and the first electrode. A portion of the first electrode is between one of the first compound portions and an other one of the first compound portions.

18 Claims, 17 Drawing Sheets

(51) Int. Cl.
| | |
|---|---|
| H01L 29/207 | (2006.01) |
| H01L 29/20 | (2006.01) |
| H01L 23/29 | (2006.01) |
| H01L 29/423 | (2006.01) |
| H01L 29/51 | (2006.01) |
| H01L 29/40 | (2006.01) |

(52) U.S. Cl.
CPC .......... *H01L 29/207* (2013.01); *H01L 29/402* (2013.01); *H01L 29/42364* (2013.01); *H01L 29/517* (2013.01); *H01L 29/7783* (2013.01); *H01L 29/7786* (2013.01); *H01L 29/7787* (2013.01)

(56) References Cited

U.S. PATENT DOCUMENTS

| | | | | |
|---|---|---|---|---|
| 2012/0187413 | A1* | 7/2012 | Saito | H01L 29/7787 257/76 |
| 2013/0056746 | A1* | 3/2013 | Joshin | H01L 29/7786 257/76 |
| 2014/0203289 | A1* | 7/2014 | Liu | H01L 29/7787 257/76 |
| 2014/0264379 | A1* | 9/2014 | Kub | H01L 29/66477 257/77 |
| 2015/0263107 | A1* | 9/2015 | Kobayashi | H01L 21/823475 257/367 |
| 2016/0043187 | A1* | 2/2016 | Saito | H01L 29/78 257/76 |
| 2016/0064488 | A1* | 3/2016 | Takado | H01L 29/157 257/20 |
| 2016/0071939 | A1* | 3/2016 | Matsushita | H01L 29/41766 257/192 |
| 2017/0110598 | A1* | 4/2017 | Chen | H01L 29/66143 |
| 2017/0125562 | A1* | 5/2017 | Prechtl | H01L 29/1029 |
| 2017/0250273 | A1* | 8/2017 | Schultz | H01L 29/7783 |
| 2017/0345919 | A1* | 11/2017 | Oyama | H01L 29/0657 |
| 2018/0069112 | A1 | 3/2018 | Inumiya | |
| 2018/0097096 | A1 | 4/2018 | Sugiyama et al. | |
| 2018/0219088 | A1* | 8/2018 | Uesugi | H01L 29/66462 |
| 2019/0207022 | A1* | 7/2019 | Nagase | H01L 29/513 |
| 2019/0252535 | A1* | 8/2019 | Moon | H01L 29/7783 |
| 2019/0326404 | A1* | 10/2019 | Kumazaki | H01L 29/0843 |
| 2020/0027976 | A1 | 1/2020 | Mukai et al. | |
| 2020/0303532 | A1* | 9/2020 | Lin | H01L 29/7783 |
| 2020/0357905 | A1* | 11/2020 | Lu | H01L 29/41725 |

FOREIGN PATENT DOCUMENTS

| | | |
|---|---|---|
| JP | 2018-60847 | 4/2018 |
| JP | 2020-17577 | 1/2020 |

OTHER PUBLICATIONS

Anderson, T. "An AlN/Ultrathin AlGaN/GaN HEMT Structure for Enhancement-Mode Operation Using Selective Etching" IEEE Elec. Dev. Letters vol. 30 No. 12 Dec. 2009 pp. 1251-1253 (Year: 2009).*

Wei, J. "Low On-Resistance Normally-Off GaN Double-Channel Metal-Oxide-Semiconductor High-Electron-Mobility Transistor" IEEE Elec. dev. Lett. vol. 36, No. 12 Dec. 2015 pp. 1287-1290 (Year: 2015).*

Park, J. "Comparison of AlGaN/GaN High Electron Mobility Transistor with AlN or GaN as cap layer" Presentation of LG Electronics Institute of Tech. available online at Researchgate at "https://www.researchgate.net/publication/280027962_Comparison_of_AlGaNGaN_High_Electron_Mobility_Transistor_with_AlN_or_GaN_as_a_cap_layer" as of Aug. 2015 (Year: 2015).*

* cited by examiner

SEMICONDUCTOR DEVICE

CROSS-REFERENCE TO RELATED APPLICATIONS

This application is based upon and claims the benefit of priority from Japanese Patent Application No. 2019-080072, filed on Apr. 19, 2019; the entire contents of which are incorporated herein by reference.

FIELD

Embodiments described herein relate generally to a semiconductor device.

BACKGROUND

For example, there is a semiconductor device such as a transistor or the like that uses a nitride semiconductor. It is desirable to improve the characteristics of the semiconductor device.

DETAILED DESCRIPTION

Figure 1:
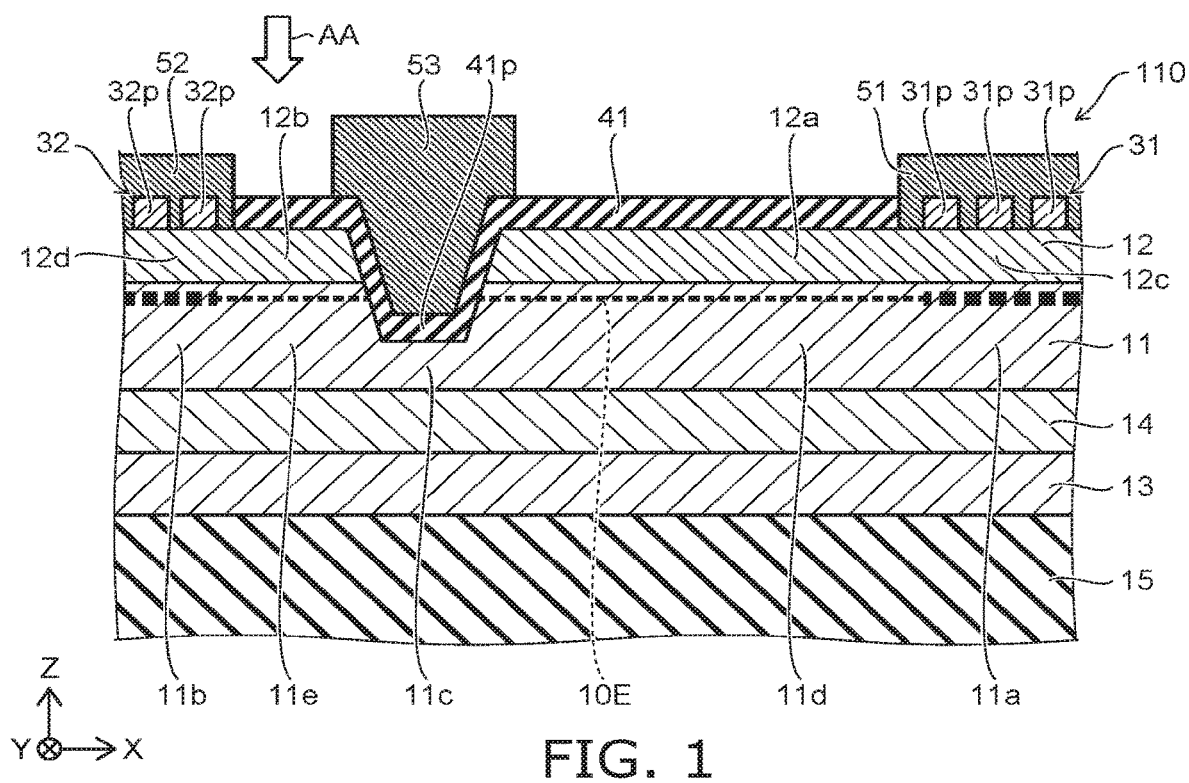
FIG. 1 is a schematic cross-sectional view illustrating a semiconductor device according to a first embodiment.

According to one embodiment, a semiconductor device includes a first electrode, a second electrode, a third electrode, a first semiconductor layer, a second semiconductor layer, and a first compound member. A position of the third electrode in a first direction is between a position of the second electrode in the first direction and a position of the first electrode in the first direction. The first direction is from the second electrode toward the first electrode. The first semiconductor layer includes $Al_{x1}Ga_{1-x1}N$ ($0 \leq x1 < 1$). The first semiconductor layer includes a first partial region, a second partial region, a third partial region, a fourth partial region, and a fifth partial region. A second direction from the first partial region toward the first electrode crosses the first direction. A direction from the second partial region toward the second electrode is aligned with the second direction. A direction from the third partial region toward the third electrode is aligned with the second direction. The fourth partial region is between the third partial region and the first partial region in the first direction. The fifth partial region is between the second partial region and the third partial region in the first direction. The second semiconductor layer includes $Al_{x2}Ga_{1-x2}N$ ($0 < x2 < 1$ and $x1 < x2$). The second semiconductor layer includes a first semiconductor region, a second semiconductor region, and a third semiconductor region. A direction from the fourth partial region toward the first semiconductor region is aligned with the second direction. A direction from the fifth partial region toward the second semiconductor region is aligned with the second direction. The third semiconductor region is between the first partial region and the first electrode in the second direction. The first compound member includes $Al_{y1}Ga_{1-y1}N$ ($0 < y1 \leq 1$ and $x2 < y1$) and includes a plurality of first compound portions. The first compound portions are between the third semiconductor region and the first electrode. A portion of the first electrode is between one of the plurality of first compound portions and an other one of the plurality of first compound portions.

According to another embodiment, a semiconductor device includes a first electrode, a second electrode, a third electrode, a first semiconductor layer, a second semiconductor layer, a compound member, and a first insulating layer. A position of the third electrode in a first direction is between a position of the second electrode in the first direction and a position of the first electrode in the first direction. The first direction is from the second electrode toward the first electrode. The first semiconductor layer includes $Al_{x1}Ga_{1-x1}N$ (0≤x1<1). The first semiconductor layer includes a first partial region, a second partial region, a third partial region, a fourth partial region, a fifth partial region, and a sixth partial region. A second direction from the first partial region toward the first electrode crosses the first direction. A direction from the second partial region toward the second electrode is aligned with the second direction. A direction from the third partial region toward the third electrode is aligned with the second direction. The fourth partial region is between the third partial region and the first partial region in the first direction. The fifth partial region is between the second partial region and the third partial region in the first direction. The sixth partial region is between the third partial region and the fourth partial region in the first direction. The second semiconductor layer includes $Al_{x2}Ga_{1-x2}N$ (0<x2<1 and x1<x2). The second semiconductor layer includes a first semiconductor region and a second semiconductor region. A direction from the fourth partial region toward the first semiconductor region is aligned with the second direction. A direction from the fifth partial region toward the second semiconductor region is aligned with the second direction. The compound member includes $Al_{y3}Ga_{1-y3}N$ (0<y3≤1 and x2<y3). A direction from the fourth partial region toward the compound member is aligned with the second direction. The first insulating layer includes a first insulating region. A portion of the first semiconductor region is between the fourth partial region and the compound member in the second direction. An other portion of the first semiconductor region is between the sixth partial region and the first insulating region in the second direction.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

First Embodiment

FIG. 1 is a schematic cross-sectional view illustrating a semiconductor device according to a first embodiment.

As shown in FIG. 1, the semiconductor device 110 according to the embodiment includes a first electrode 51, a second electrode 52, a third electrode 53, a first semiconductor layer 11, a second semiconductor layer 12, and a first compound member 31.

A first direction from the second electrode 52 toward the first electrode 51 is taken as an X-axis direction. One direction perpendicular to the X-axis direction is taken as a Z-axis direction. A direction perpendicular to the X-axis direction and the Z-axis direction is taken as a Y-axis direction.

The position of the third electrode 53 in the first direction (the X-axis direction) is between the position of the second electrode 52 in the first direction and the position of the first electrode 51 in the first direction. For example, the third electrode 53 is between the second electrode 52 and the first electrode 51 in the X-axis direction.

The first semiconductor layer 11 includes $Al_{x1}Ga_{1-x1}N$ (0≤x1<1). The first semiconductor layer 11 includes, for example, GaN. For example, the first semiconductor layer 11 is substantially parallel to the X-Y plane.

The first semiconductor layer 11 includes a first partial region 11a, a second partial region 11b, a third partial region 11c, a fourth partial region 11d, and a fifth partial region 11e.

A second direction from the first partial region 11a toward the first electrode 51 crosses the first direction (the X-axis direction). The second direction is, for example, the Z-axis direction.

The direction from the second partial region 11b toward the second electrode 52 is aligned with the second direction (e.g., the Z-axis direction). The direction from the third partial region 11c toward the third electrode 53 is aligned with the second direction (e.g., the Z-axis direction). The fourth partial region 11d is between the third partial region 11c and the first partial region 11a in the first direction (the X-axis direction). The fifth partial region 11e is between the second partial region 11b and the third partial region 11c in the first direction (the X-axis direction).

The first partial region 11a is a portion under the first electrode 51. The second partial region 11b is a portion under the second electrode 52. The third partial region 11c is a portion under the third electrode 53.

The second semiconductor layer 12 includes $Al_{x2}Ga_{1-x2}N$ (0<x2<1 and x1<x2). The second semiconductor layer 12 includes, for example, AlGaN. The second semiconductor layer 12 includes, for example, $Al_{0.3}Ga_{0.7}N$, etc.

The second semiconductor layer 12 includes a first semiconductor region 12a, a second semiconductor region 12b, and a third semiconductor region 12c. The direction from the fourth partial region 11d toward the first semiconductor region 12a is aligned with the second direction (e.g., the Z-axis direction). The direction from the fifth partial region 11e toward the second semiconductor region 12b is aligned with the second direction (e.g., the Z-axis direction). The third semiconductor region 12c is between the first partial region 11a and the first electrode 51 in the second direction (e.g., the Z-axis direction). The third semiconductor region 12c is a portion under the first electrode 51.

In the example, the second semiconductor layer 12 further includes a fourth semiconductor region 12d. The fourth semiconductor region 12d is between the second partial region 11b and the second electrode 52 in the second direction (e.g., the Z-axis direction). The fourth semiconductor region 12d is a portion under the second electrode 52.

The first compound member 31 includes $Al_{y1}Ga_{1-y1}N$ (0<y1≤1 and x2<y1). The first compound member 31 includes, for example, AlN.

The first compound member 31 includes multiple first compound portions 31p. The multiple first compound portions 31p are between the third semiconductor region 12c and the first electrode 51. A portion of the first electrode 51 is between one of the multiple first compound portions 31p and another one of the multiple first compound portions 31p.

A substrate 15, a first intermediate layer 13, and a second intermediate layer 14 are provided in the example. The first intermediate layer 13 is between the substrate 15 and the second semiconductor layer 12. The second intermediate layer 14 is between the first intermediate layer 13 and the second semiconductor layer 12. The first semiconductor layer 11 is between the second intermediate layer 14 and the second semiconductor layer 12. The substrate 15 is, for example, a silicon substrate. The first intermediate layer 13 is, for example, a buffer layer. The first intermediate layer 13 includes, for example, multiple stacked nitride semiconductor films, etc. The second intermediate layer 14 includes, for example, p-type GaN, etc.

The first electrode 51 is electrically connected to the third semiconductor region 12c. The second electrode 52 is electrically connected to the fourth semiconductor region 12d.

The distance between the first electrode 51 and the third electrode 53 is longer than the distance between the second electrode 52 and the third electrode 53.

A carrier region 10E is formed in a region of the first semiconductor layer 11 opposing the second semiconductor layer 12. The carrier region 10E is, for example, a two-dimensional electron gas.

A current that flows between the first electrode 51 and the second electrode 52 can be controlled by a voltage applied to the third electrode 53. For example, the first electrode 51 functions as a drain electrode. For example, the second electrode 52 functions as a source electrode. For example, the third electrode functions as a gate electrode. For example, the semiconductor device 110 functions as a HEMT (High Electron Mobility Transistor).

A first insulating layer 41 is provided in the example. A portion 41p of the first insulating layer 41 is between the third partial region 11c and the third electrode 53 in the second direction (the Z-axis direction). The portion 41p of the first insulating layer 41 functions as a gate insulating film.

In the semiconductor device 110 as recited above, the multiple first compound portions 31p are provided between the third semiconductor region 12c and the first electrode 51; and a portion of the first electrode 51 is between the multiple first compound portions 31p. The first semiconductor layer 11 and the second semiconductor layer 12 include a "region under" the multiple first compound portions 31p. The carrier concentration in the "region-under" is higher than the carrier concentration in the region between the third electrode 53 and the first electrode 51 due to the multiple first compound portions 31p of AlN, etc. The carrier concentration in the "region under" the multiple first compound portions 31p can be set to be high locally. The first electrode 51 is electrically connected to the second semiconductor layer 12 in the region between the multiple first compound portions 31p. Thereby, a low resistance is obtained for the electrical connection between the first electrode 51 and the second semiconductor layer 12. A low on-resistance is obtained thereby. A semiconductor device can be provided in which the characteristics can be improved.

The electrical resistance of AlN is high. AlN is substantially insulative. Therefore, generally, when insulative AlN is provided between a semiconductor layer and an electrode, the contact area decreases, and the resistance increases. In the embodiment, the multiple first compound portions 31p of AlN, etc., are provided on the stacked body of the first semiconductor layer 11 and the second semiconductor layer 12. The carrier density under the multiple first compound portions 31p can be increased locally by the multiple first compound portions 31p. Electrical connections are obtained under the regions between the multiple first compound portions 31p. An electrical connection having low resistance is obtained thereby.

As shown in FIG. 1, for example, a portion (the portion between the multiple first compound portions 31p) of the first electrode 51 contacts the third semiconductor region 12c.

For example, the one of the multiple first compound portions 31p recited above and the other one of the multiple first compound portions 31p recited above contact the third semiconductor region 12c.

As shown in FIG. 1, the semiconductor device 110 may further include a second compound member 32. The second compound member 32 includes $Al_{y2}Ga_{1-y2}N$ ($0<y2\leq1$ and $x2<y2$). The second compound member 32 includes, for example, AlN. The fourth semiconductor region 12d is between the second partial region 11b and the second electrode 52 in the second direction (the Z-axis direction).

The second compound member 32 includes multiple second compound portions 32p. The multiple second compound portions 32p are between the fourth semiconductor region 12d and the second electrode 52. A portion of the second electrode 52 is between one of the multiple second compound portions 32p and another one of the multiple second compound portions 32p. Thereby, for example, the carrier concentration can be set to be high locally in the "region under" the multiple second compound portions 32p. The second electrode 52 is electrically connected to the second semiconductor layer 12 in the region between the multiple second compound portions 32p. Thereby, a low resistance is obtained for the electrical connection between the second electrode 52 and the second semiconductor layer 12. A low on-resistance is obtained thereby. A semiconductor device can be provided in which the characteristics can be improved.

As shown in FIG. 1, for example, a portion (the portion between the multiple second compound portions 32p) of the second electrode 52 contacts the fourth semiconductor region 12d.

For example, the one of the multiple second compound portions 32p recited above and the other one of the multiple second compound portions 32p recited above contact the fourth semiconductor region 12d.

In the semiconductor device 110, at least a portion of the third electrode 53 is between the first semiconductor region 12a and the second semiconductor region 12b in the first direction (the X-axis direction). A normally-off operation is obtained easily.

In the embodiment, the distance between one of the multiple first compound portions 31p and another one of the multiple first compound portions 31p next to the one of the multiple first compound portions 31p is, for example, not less than 100 nm and not more than 2000 nm. By setting the distance to 350 nm or more, for example, the adhesion of the first electrode 51 is improved easily. By setting the distance to 700 nm or less, for example, the carrier concentration can be higher.

The width of one of the multiple first compound portions 31p along a direction from the one of the multiple first compound portions 31p toward another one of the multiple first compound portions 31p next to the one of the multiple first compound portions 31p is, for example, not less than 100 nm and not more than 2000 nm. By setting the width to 350 nm or more, for example, a stable interface is easier to obtain between the multiple first compound portions 31p and the second semiconductor layer 12. By setting the width to 700 nm or less, for example, the path of the electrical connection can be shortened.

Examples of patterns of the first compound member 31 and the second compound member 32 will now be described.

Figure 2A:
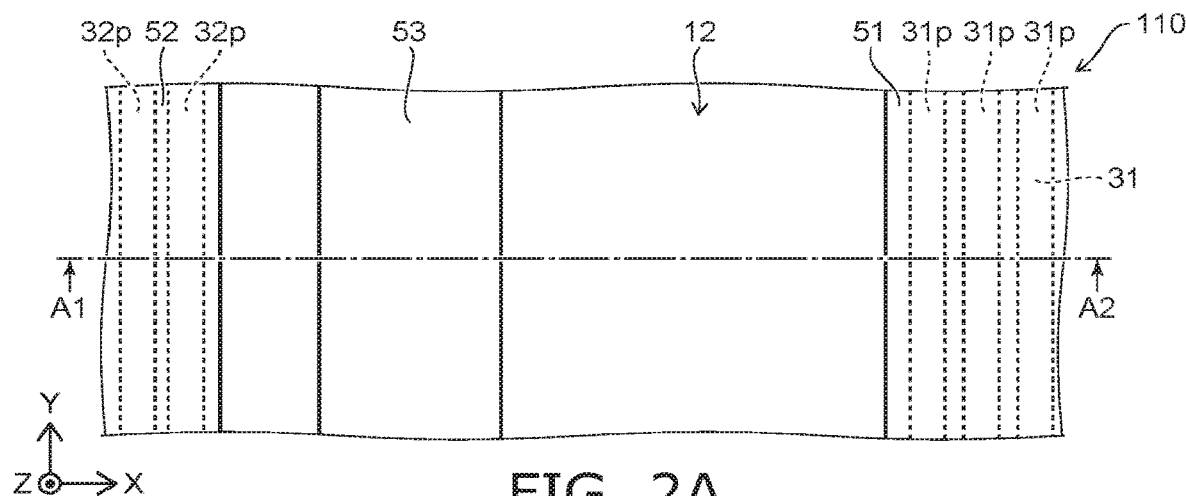
FIG. 2A to FIG. 2C are schematic plan views illustrating semiconductor devices according to the first embodiment.
Figure 2B:
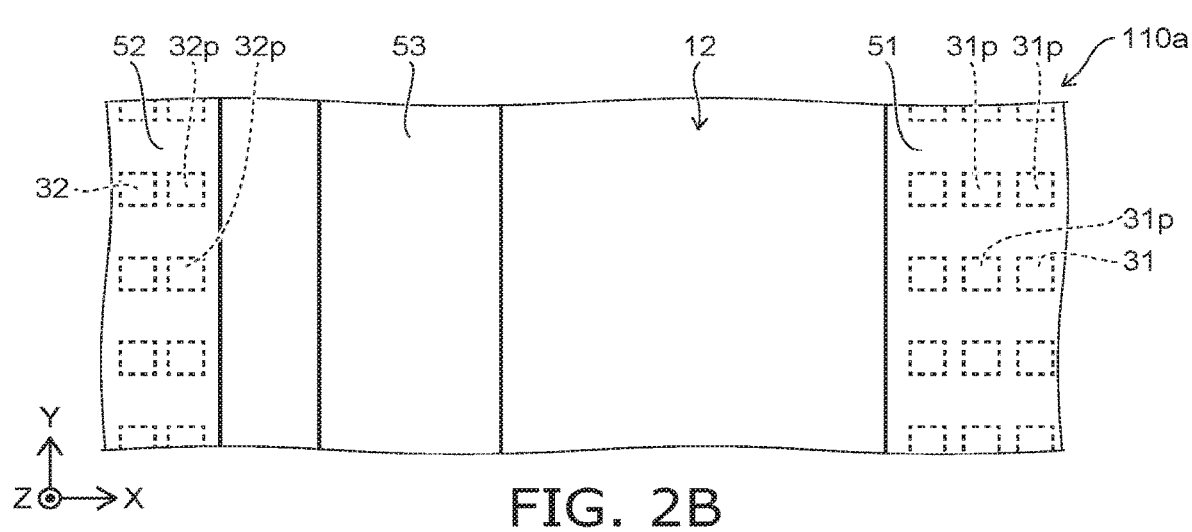
Figure 2C:
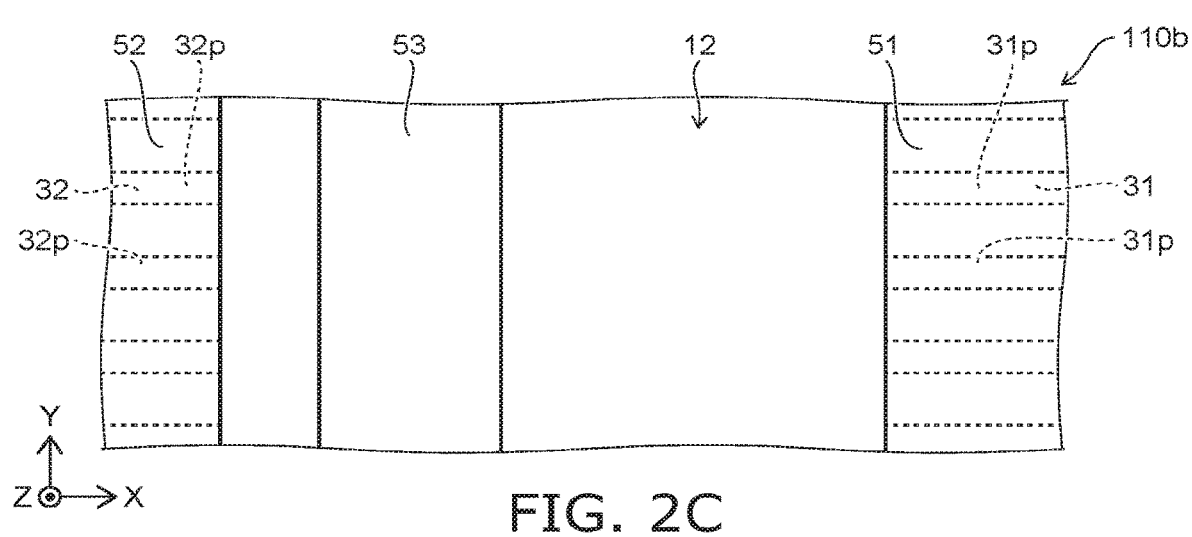

FIG. 2A to FIG. 2C are schematic plan views illustrating semiconductor devices according to the first embodiment.

FIG. 2A to FIG. 2C are plan views when viewed along arrow AA of FIG. 1. A line A1-A2 cross section of FIG. 2A corresponds to FIG. 1. Other than the pattern of the multiple first compound portions 31p and the pattern of the multiple second compound portions 32p, semiconductor devices 110a and 110b illustrated in FIG. 2B and FIG. 2C have configurations similar to that of the semiconductor device 110.

In the example (the semiconductor device 110) shown in FIG. 2A, the direction from one of the multiple first compound portions 31p toward another one of the multiple first compound portions 31p has a component in the first direction (the X-axis direction). For example, the multiple first compound portions 31p have stripe configurations extending along the Y-axis direction.

In the example (the semiconductor device 110) shown in FIG. 2A, the direction from one of the multiple second compound portions 32p toward another one of the multiple second compound portions 32p has a component in the first direction (the X-axis direction). For example, the multiple second compound portions 32p have stripe configurations extending along the Y-axis direction.

In the example (the semiconductor device 110b) shown in FIG. 2C, the direction from one of the multiple first compound portions 31p toward another one of the multiple first compound portions 31p has a component in a third direction crossing a plane (the X-Z plane) including the first direction and the second direction. The third direction is, for example, the Y-axis direction. For example, the multiple first compound portions 31p have stripe configurations extending along the X-axis direction.

In the example (the semiconductor device 110b) shown in FIG. 2C, the direction from one of the multiple second compound portions 32p toward another one of the multiple second compound portions 32p has a component in the third direction (e.g., the Y-axis direction). For example, the multiple second compound portions 32p have stripe configurations extending along the X-axis direction.

In the example (the semiconductor device 110a) shown in FIG. 2B, the multiple first compound portions 31p that have island configurations are arranged along the X-axis direction and the Y-axis direction. In the example (the semiconductor device 110a) shown in FIG. 2B, the multiple second compound portions 32p that have island configurations are arranged along the X-axis direction and the Y-axis direction.

In the embodiment, various modifications of the pattern of the multiple first compound portions 31p and the pattern of the multiple second compound portions 32p are possible. For example, the pattern of the multiple first compound portions 31p illustrated in FIG. 2A and the pattern of the multiple second compound portions 32p illustrated in FIG. 2C may be combined.

Two of the multiple first compound portions 31p may be continuous with each other. For example, the end portions of two of the multiple first compound portions 31p illustrated in FIG. 2A may be connected to each other. Two of the multiple second compound portions 32p may be continuous with each other. For example, the end portions of two of the multiple second compound portions 32p illustrated in FIG. 2A may be connected to each other.

Second Embodiment

Figure 3:
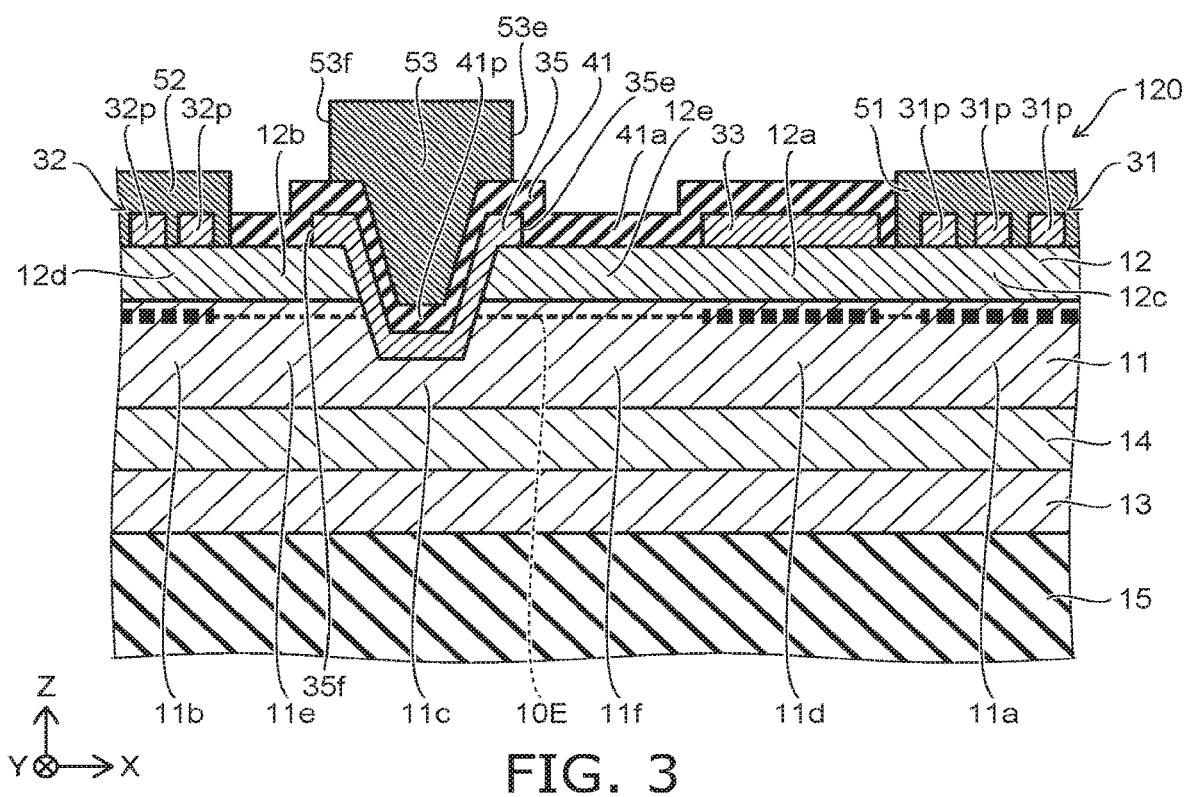
FIG. 3 is a schematic cross-sectional view illustrating a semiconductor device according to a second embodiment.

FIG. 3 is a schematic cross-sectional view illustrating a semiconductor device according to a second embodiment.

As shown in FIG. 3, the semiconductor device 120 according to the embodiment includes the first electrode 51, the second electrode 52, the third electrode 53, the first semiconductor layer 11, the second semiconductor layer 12, and the first compound member 31. The semiconductor device 120 further includes a third compound member 33. The first insulating layer 41 includes a first insulating region 41a. Otherwise, the configuration of the semiconductor device 120 is similar to the configuration of the semiconductor device 110. Examples of the third compound member 33 and the first insulating region 41a will now be described.

The third compound member 33 includes $Al_{y3}Ga_{1-y3}N$ ($0<y3\leq1$ and $x2<y3$). The third compound member 33 includes, for example, AlN. The third compound member 33 may include, for example, a configuration and materials similar to those of the first compound member 31. The third compound member 33 may include, for example, a configuration and materials similar to those of the second compound member 32.

The first semiconductor layer 11 further includes a sixth partial region 11f. The sixth partial region 11f is between the third partial region 11c and the fourth partial region 11d in the first direction (the X-axis direction). The second semiconductor layer 12 further includes a fifth semiconductor region 12e. The direction from the sixth partial region 11f toward the fifth semiconductor region 12e is aligned with the second direction (e.g., the Z-axis direction).

The first semiconductor region 12a is between the fourth partial region 11d and the third compound member 33 in the second direction (the Z-axis direction). The first insulating region 41a of the first insulating layer 41 is between the third compound member 33 and at least a portion of the third electrode 53 in the first direction (the X-axis direction).

The carrier concentration is high locally in the portion positioned under the third compound member 33. The concentration of the electric field between the third electrode 53 and the first electrode 51 can be relaxed thereby. For example, the breakdown voltage can be increased thereby. According to the second embodiment, a semiconductor device can be provided in which the characteristics can be improved.

For example, the third compound member 33 contacts the first semiconductor region 12a. For example, the first insulating region 41a contacts the fifth semiconductor region 12e.

The third compound member 33 may be continuous with one of the multiple first compound portions 31p.

As shown in FIG. 3, the third electrode 53 includes an end portion 53e. The end portion 53e is the end portion on the first electrode 51 side. The direction from another end portion 53f of the third electrode 53 toward the end portion 53e is aligned with the X-axis direction. In the example shown in FIG. 3, the position of the third compound member 33 in the X-axis direction is between the position of the end portion 53e in the X-axis direction and the position of the first electrode 51 in the X-axis direction.

Figure 4:
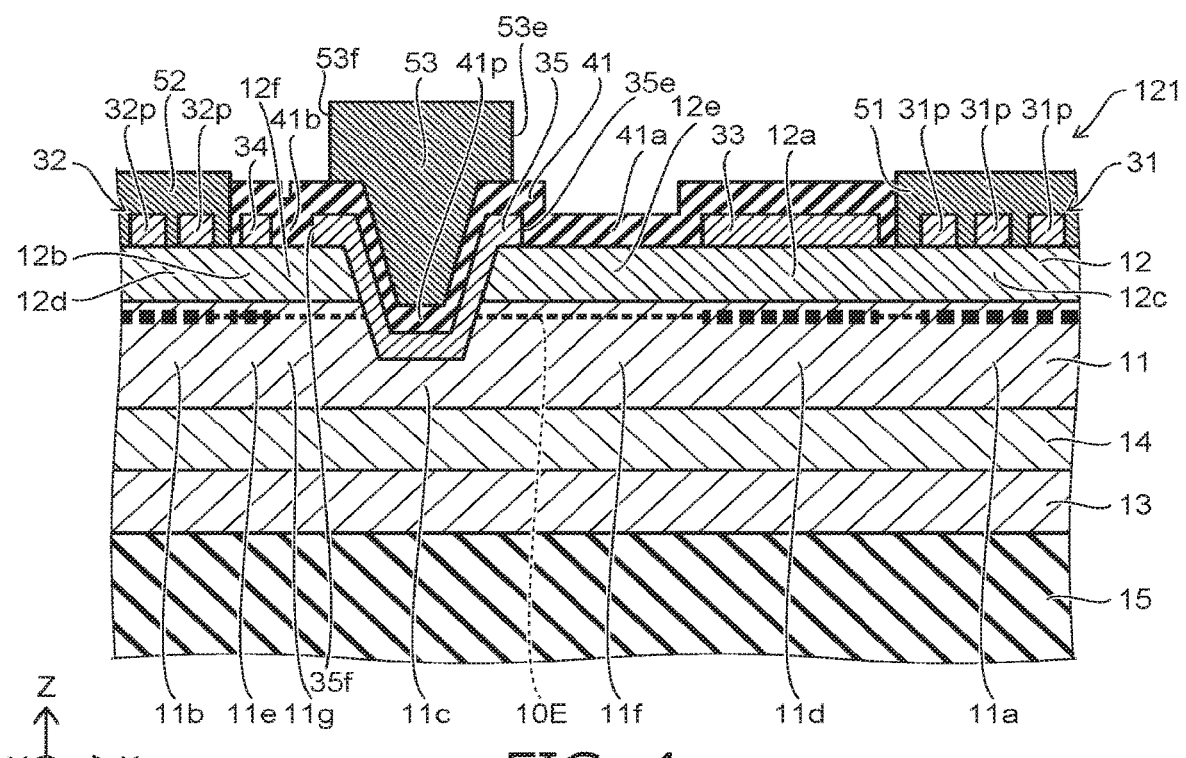
FIG. 4 is a schematic cross-sectional view illustrating a semiconductor device according to the second embodiment.

FIG. 4 is a schematic cross-sectional view illustrating a semiconductor device according to the second embodiment.

As shown in FIG. 4, the semiconductor device 121 according to the embodiment further includes a fourth compound member 34. The first insulating layer 41 includes a second insulating region 41b. Otherwise, the configuration of the semiconductor device 121 is similar to the configuration of the semiconductor device 120. Examples of the fourth compound member 34 and the second insulating region 41b will now be described.

The fourth compound member 34 includes $Al_{y4}Ga_{1-y4}N$ ($0<y4\leq1$ and $x2<y4$). The fourth compound member 34 includes, for example, AlN. The fourth compound member 34 may include, for example, a configuration and materials similar to those of the first compound member 31. The fourth compound member 34 may include, for example, a configuration and materials similar to those of the second compound member 32.

The first semiconductor layer 11 further includes a seventh partial region 11g. The seventh partial region 11g is between the fifth partial region 11e and the third partial region 11c in the first direction (the X-axis direction). The second semiconductor layer 12 further includes a sixth semiconductor region 12f. The direction from the seventh partial region 11g toward the sixth semiconductor region 12f is aligned with the second direction (the Z-axis direction).

The second semiconductor region 12b is between the fifth partial region 11e and the fourth compound member 34 in the second direction (the Z-axis direction). The second insulating region 41b of the first insulating layer 41 is between the fourth compound member 34 and at least a portion of the third electrode 53 in the first direction (the X-axis direction).

The third compound member 33 may be continuous with the first compound member 31. The third compound member 33 may be continuous with at least one of the multiple first compound portions 31p.

The carrier concentration is high locally in the portion positioned under the fourth compound member 34. The concentration of the electric field between the second electrode 52 and the third electrode 53 can be relaxed thereby. Thereby, for example, the breakdown voltage can be increased. According to the second embodiment, a semiconductor device can be provided in which the characteristics can be improved.

For example, the fourth compound member 34 contacts the second semiconductor region 12b. For example, the second insulating region 41b contacts the sixth semiconductor region 12f.

As shown in FIG. 3 and FIG. 4, the semiconductor devices 120 and 121 further include a fifth compound member 35. The fifth compound member 35 includes $Al_{y5}Ga_{1-y5}N$ ($0<y5≤1$ and $x2<y5$). The fifth compound member 35 includes, for example, AlN. The fifth compound member 35 may include, for example, a configuration and materials similar to those of the first compound member 31. The fifth compound member 35 may include, for example, a configuration and materials similar to those of the second compound member 32.

For example, a portion of the second semiconductor layer 12 is between the first semiconductor layer 11 and at least a portion of the fifth compound member 35. The first insulating region 41a of the first insulating layer 41 is between the third compound member 33 and at least a portion of the fifth compound member 35.

Another portion of the fifth compound member 35 is between the third electrode 53 and the first semiconductor layer 11. The other portion of the fifth compound member 35 is between the third electrode 53 and the portion 41p of the first insulating layer 41.

The fifth compound member 35 includes an end portion 35e. The end portion 35e is the end portion on the first electrode 51 side. The direction from another end portion 35f of the fifth compound member 35 toward the end portion 35e is aligned with the X-axis direction. In the examples shown in FIG. 3 and FIG. 4, the position of the end portion 35e in the X-axis direction is between the position of the end portion 53e in the X-axis direction and the position of the third compound member 33 in the X-axis direction.

Figure 5:
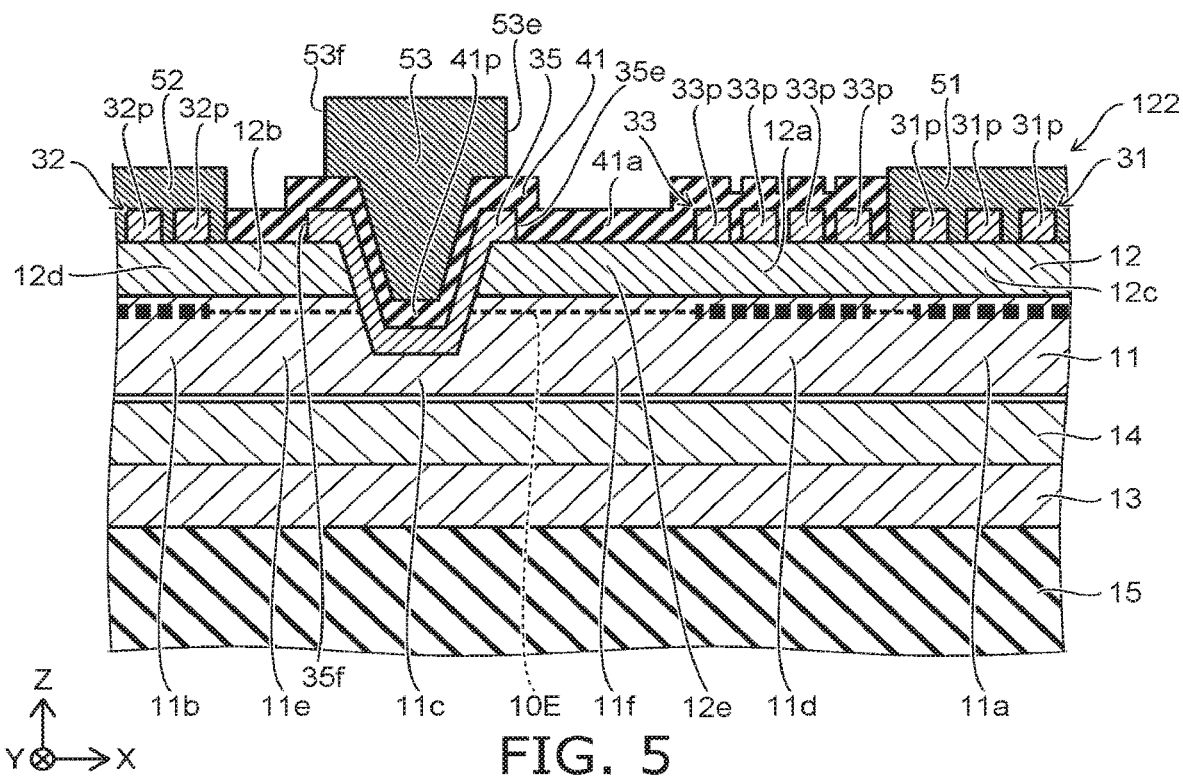
FIG. 5 is a schematic cross-sectional view illustrating a semiconductor device according to the second embodiment.

FIG. 5 is a schematic cross-sectional view illustrating a semiconductor device according to the second embodiment.

In the semiconductor device 122 according to the embodiment as shown in FIG. 5, the third compound member 33 includes multiple third compound portions 33p. Otherwise, the configuration of the semiconductor device 122 is similar to the configuration of the semiconductor device 120. An example of the multiple third compound portions 33p will now be described.

A portion of the first insulating layer 41 is between one of the multiple third compound portions 33p and another one of the multiple third compound portions 33p. For example, the profile of the electric field can be controlled by the multiple third compound portions 33p. The concentration of the electric field can be relaxed more effectively.

Two of the multiple third compound portions 33p may be continuous with each other. For example, the end portions of the two of the multiple third compound portions 33p may be connected to each other.

The fourth compound member 34 may include multiple fourth compound portions. A portion of the first insulating layer 41 may be between one of the multiple fourth compound portions and another one of the multiple fourth compound portions.

Third Embodiment

Figure 6:
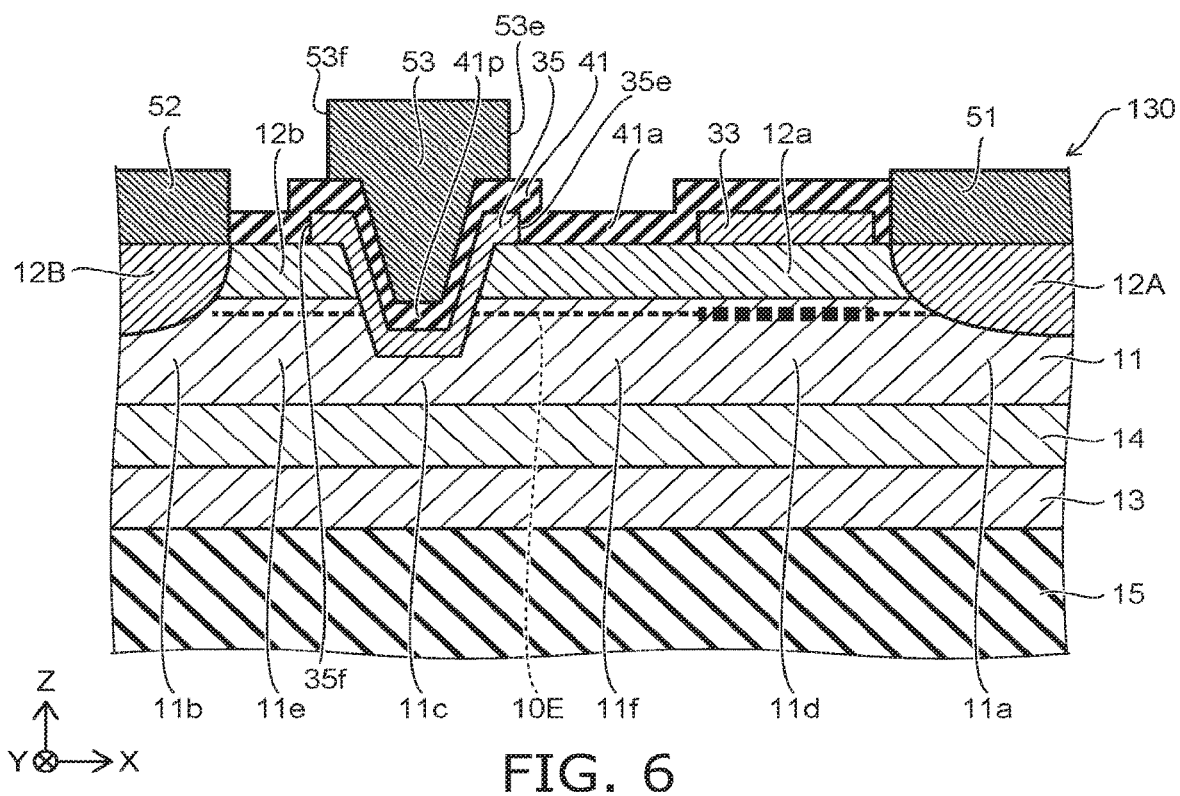
FIG. 6 is a schematic cross-sectional view illustrating a semiconductor device according to a third embodiment.
Figure 7:
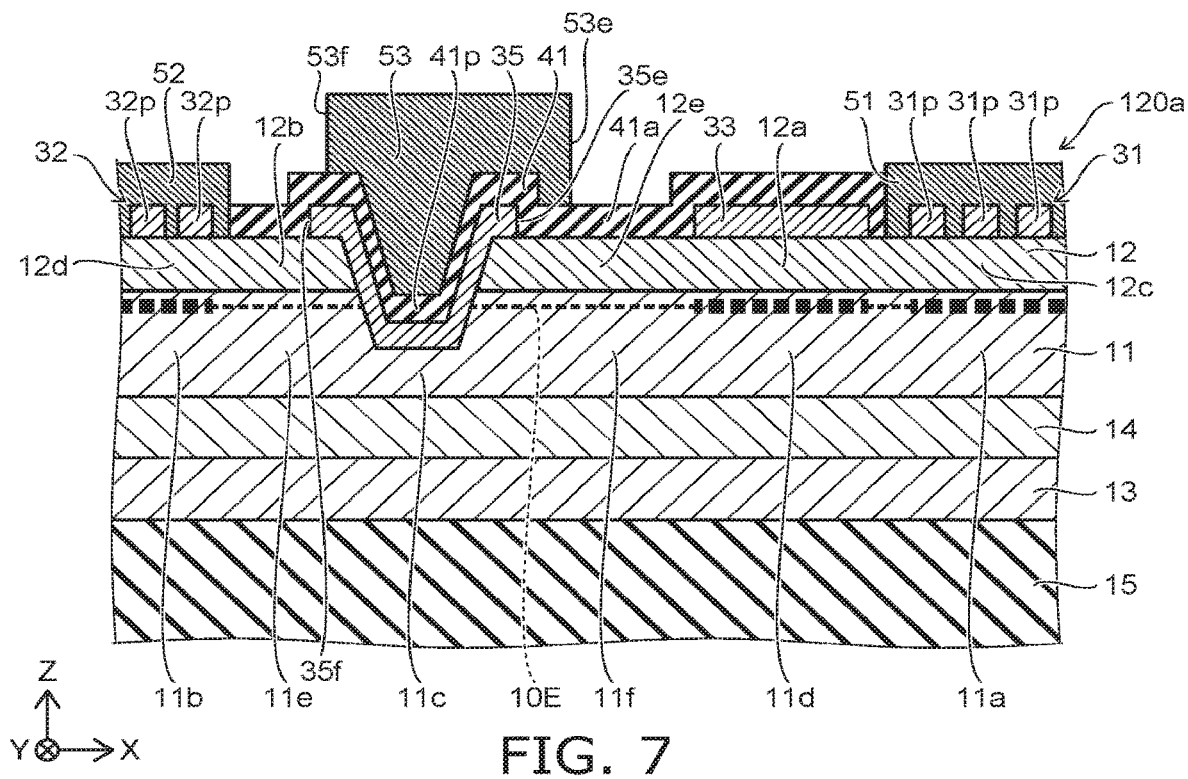
FIG. 7 is a schematic cross-sectional view illustrating a semiconductor device according to the embodiment.
Figure 8:
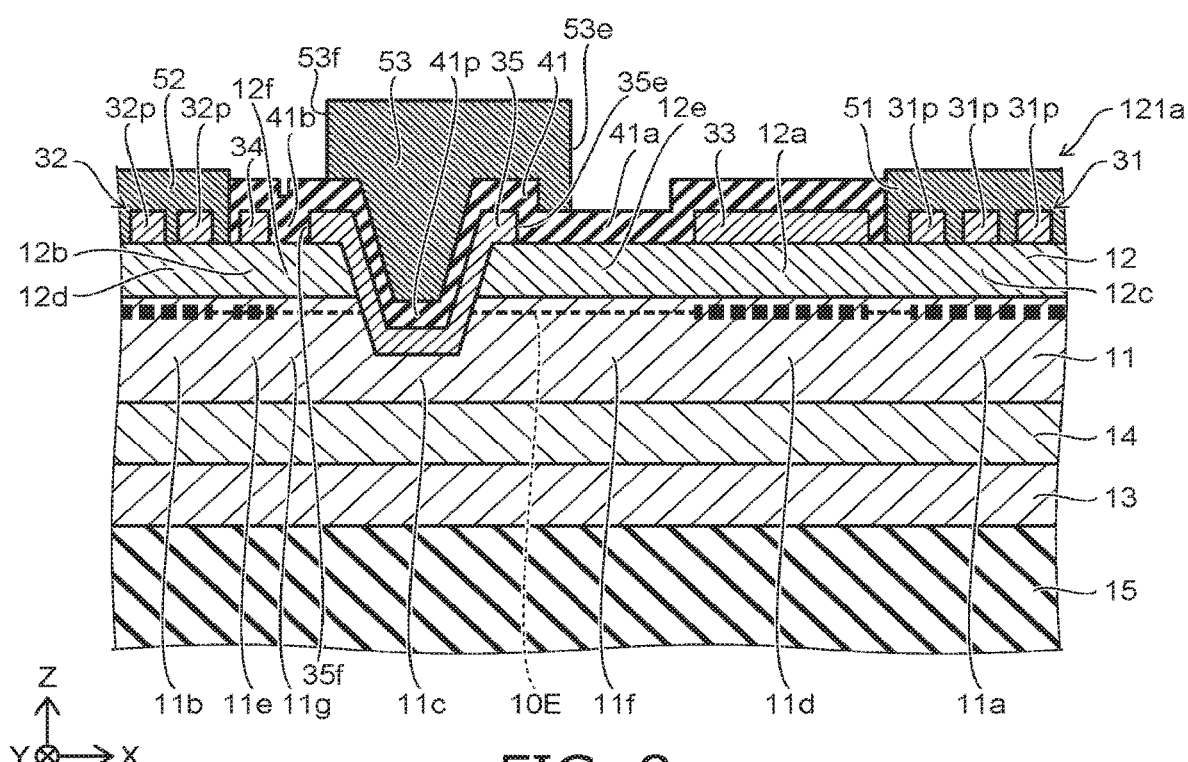
FIG. 8 is a schematic cross-sectional view illustrating a semiconductor device according to the embodiment.
Figure 9:
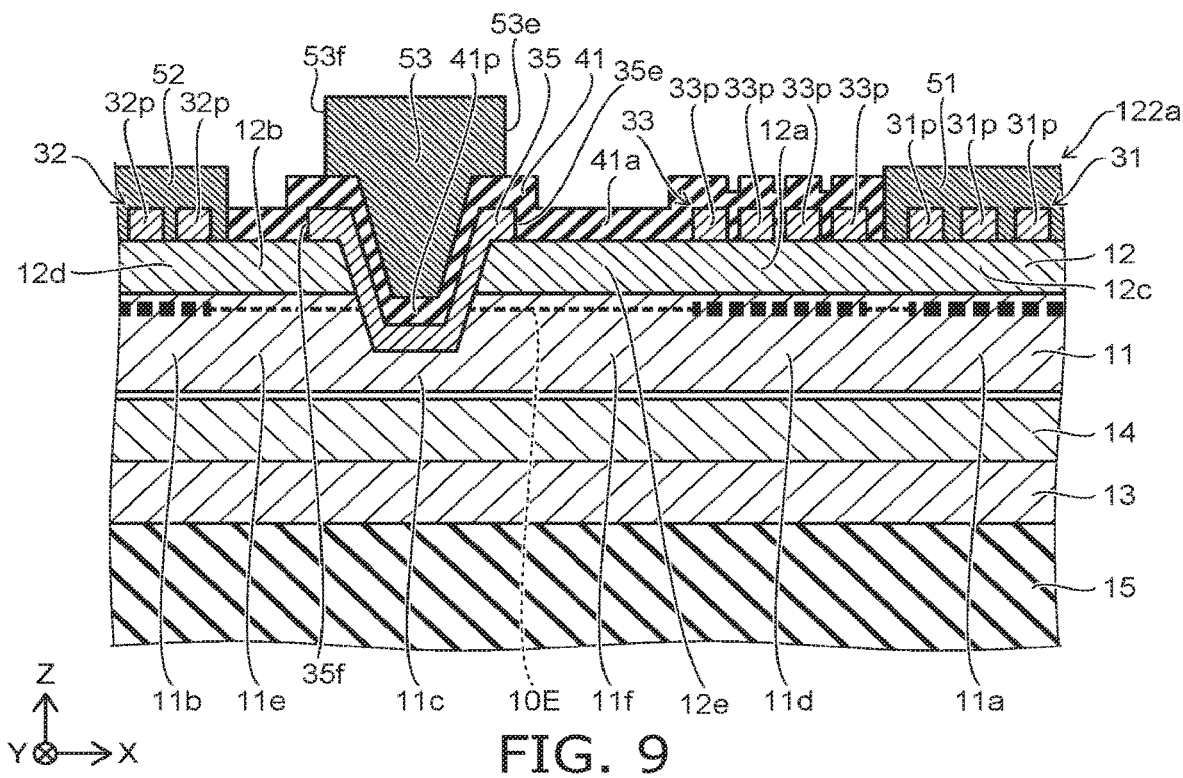
FIG. 9 is a schematic cross-sectional view illustrating a semiconductor device according to the embodiment.
Figure 10:
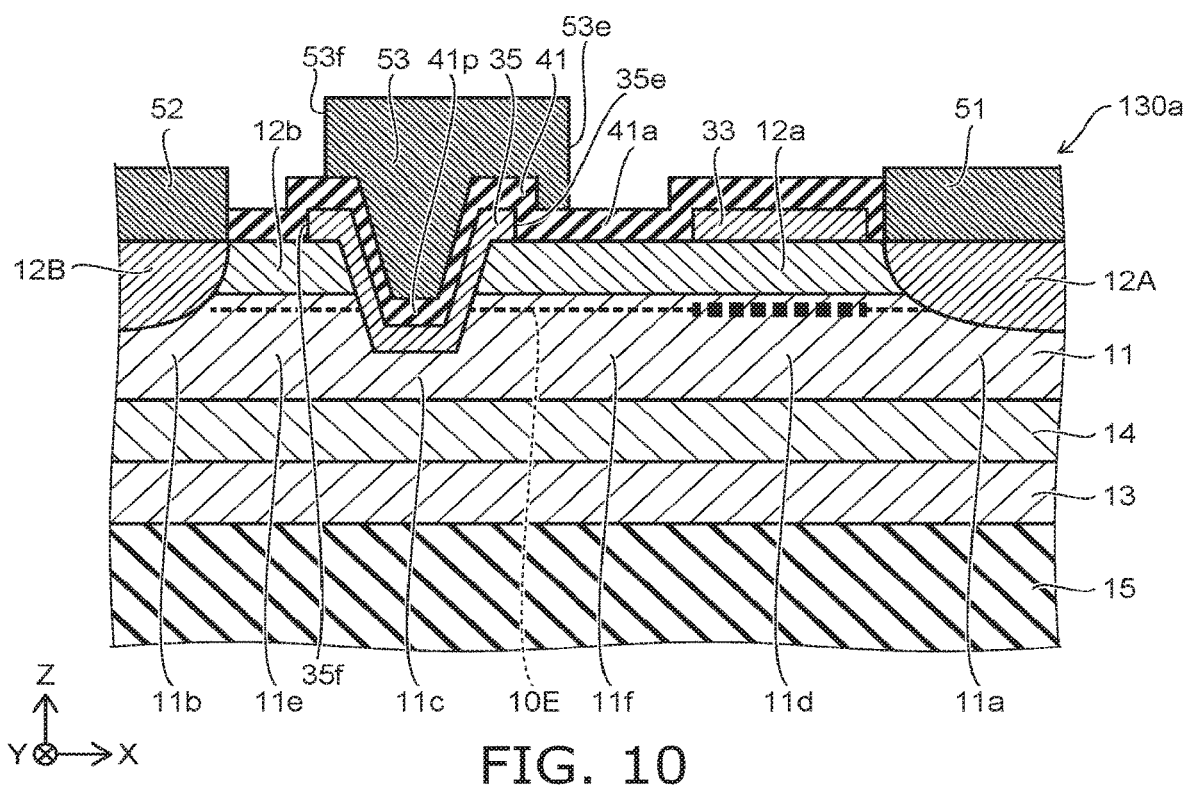
FIG. 10 is a schematic cross-sectional view illustrating a semiconductor device according to the embodiment.
Figure 11:
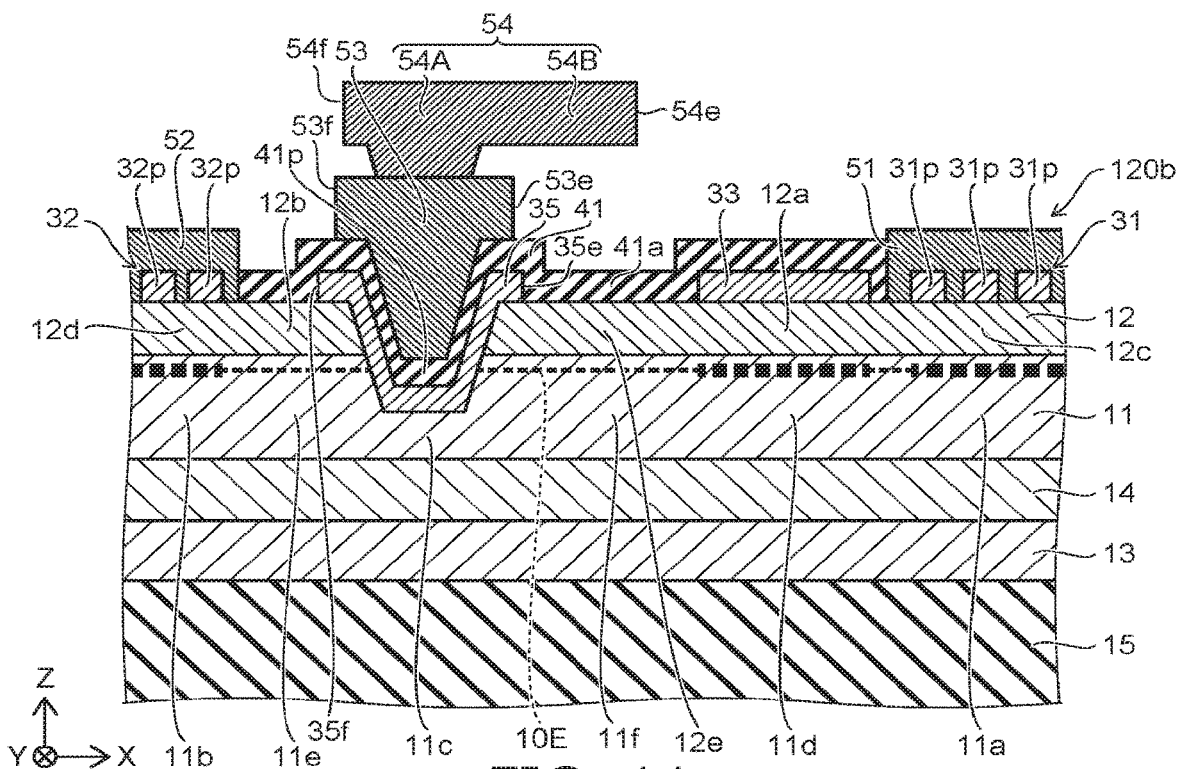
FIG. 11 is a schematic cross-sectional view illustrating a semiconductor device according to the embodiment.
Figure 12:
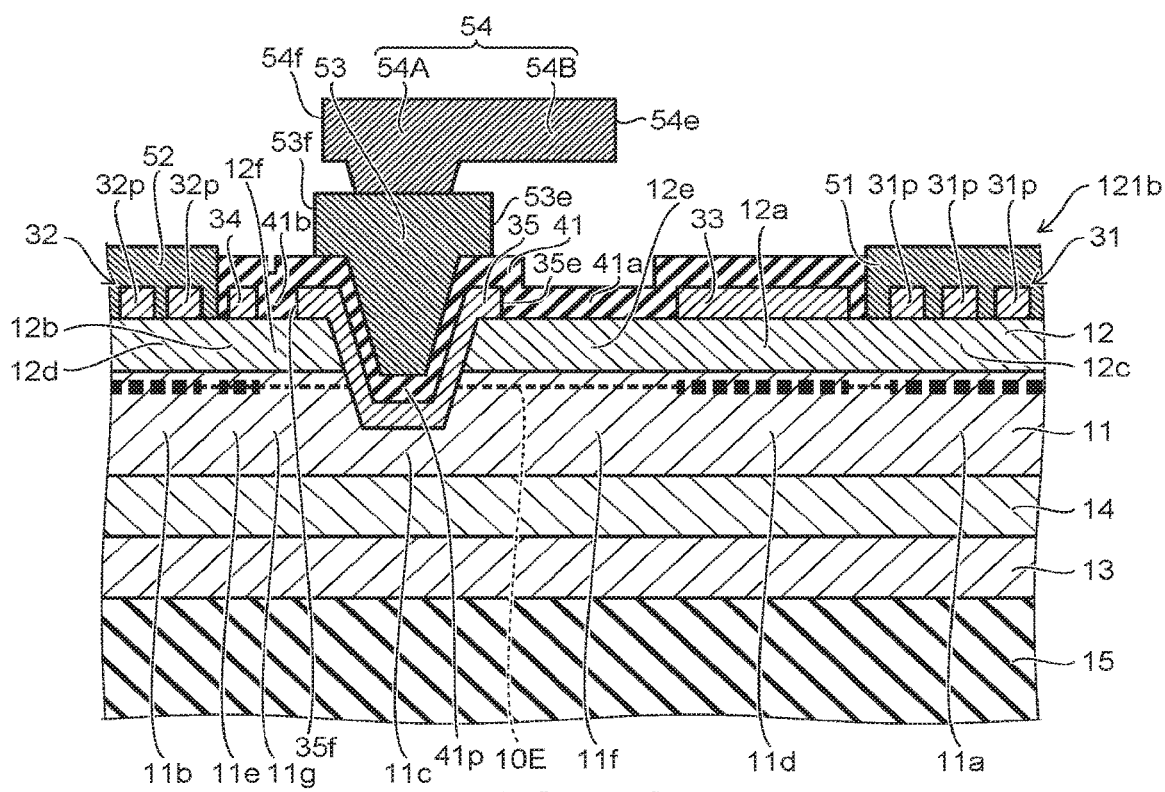
FIG. 12 is a schematic cross-sectional view illustrating a semiconductor device according to the embodiment.
Figure 13:
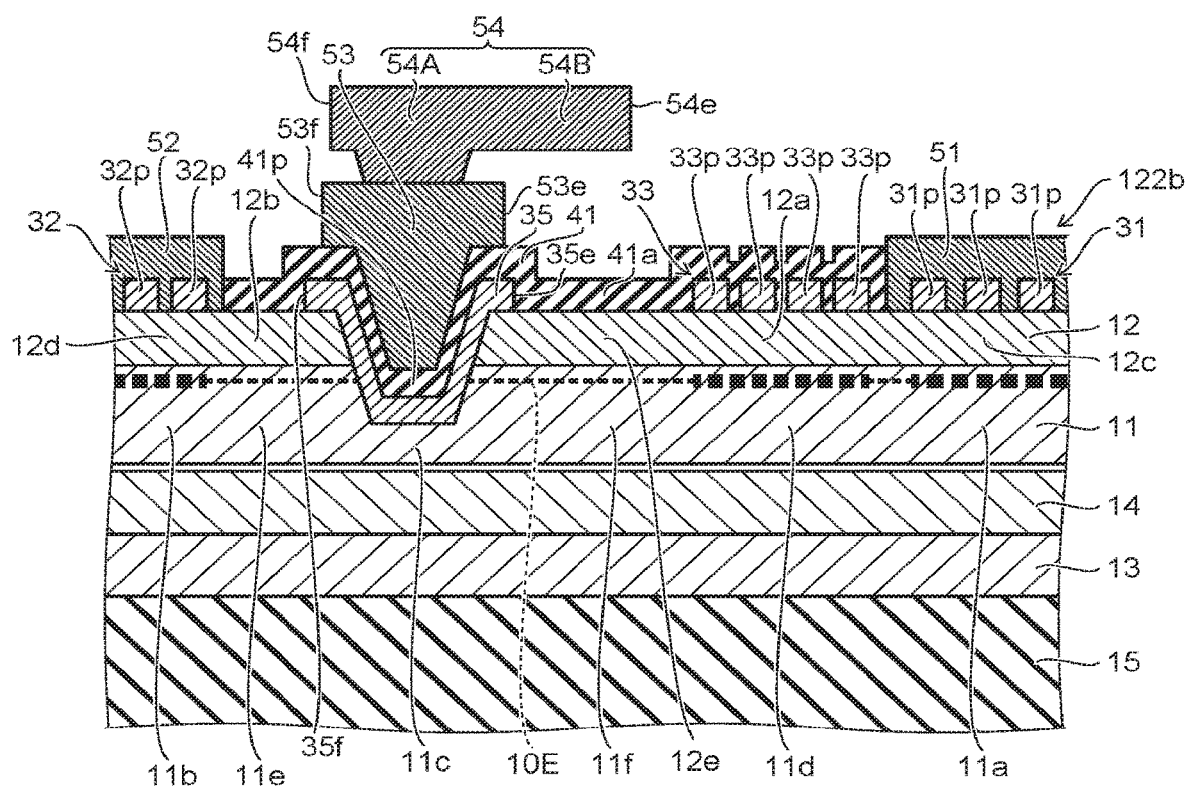
FIG. 13 is a schematic cross-sectional view illustrating a semiconductor device according to the embodiment.
Figure 14:
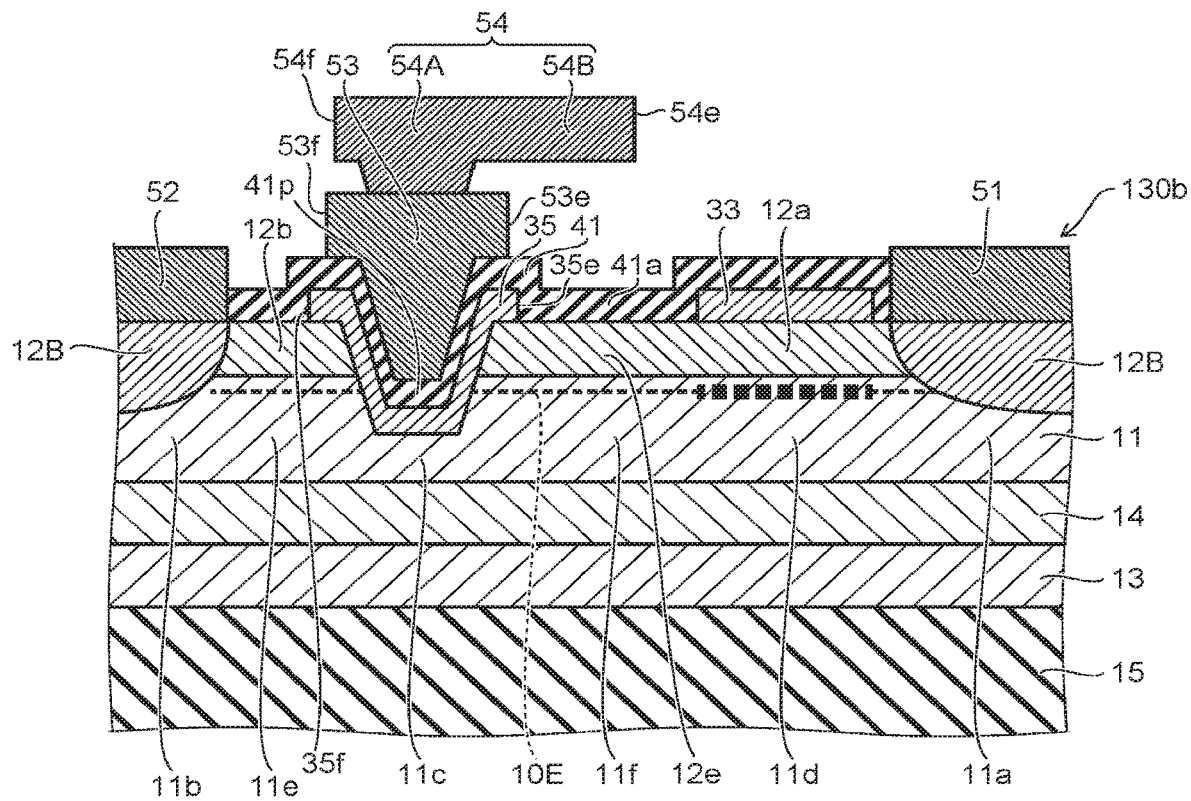
FIG. 14 is a schematic cross-sectional view illustrating a semiconductor device according to the embodiment.
Figure 15:
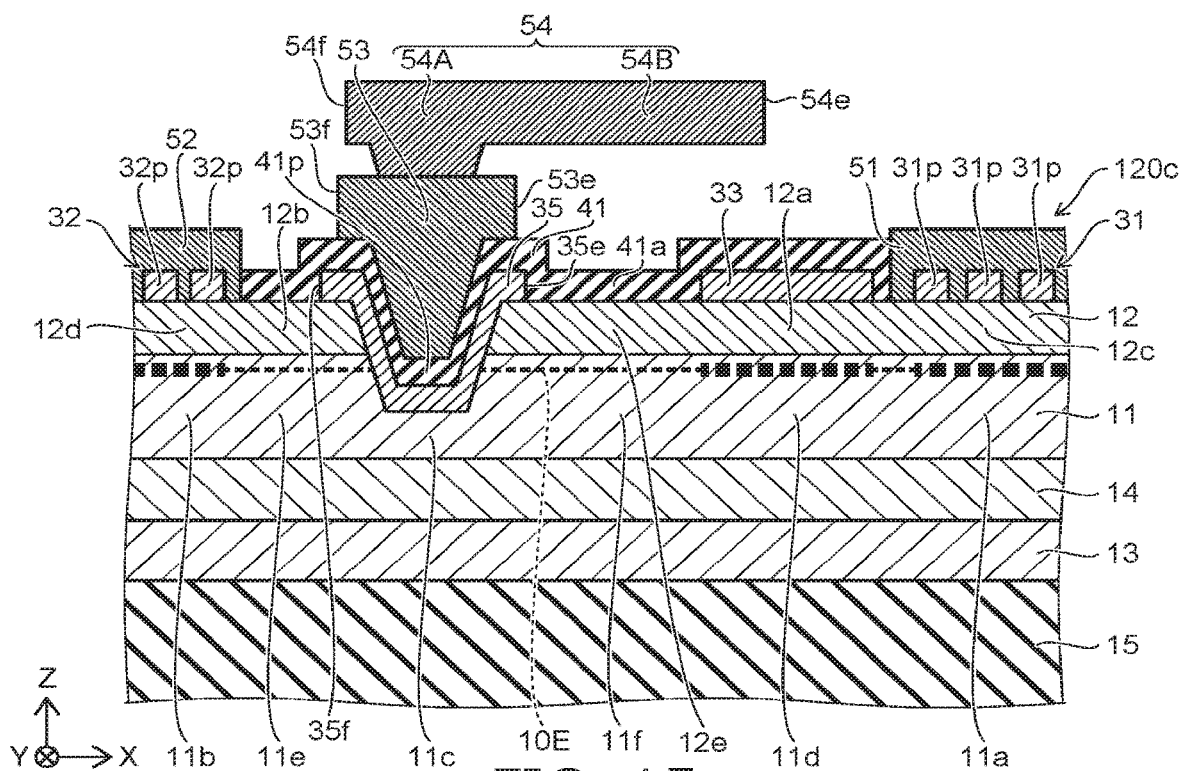
FIG. 15 is a schematic cross-sectional view illustrating a semiconductor device according to the embodiment.
Figure 16:
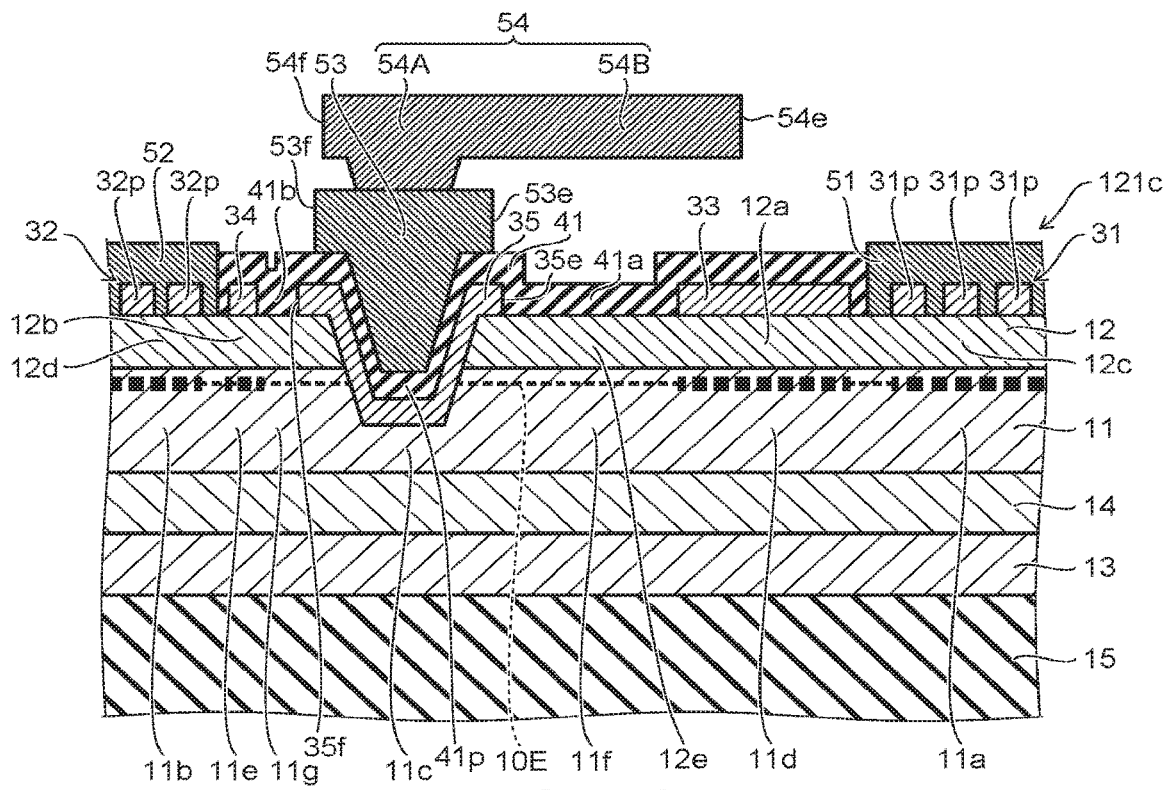
FIG. 16 is a schematic cross-sectional view illustrating a semiconductor device according to the embodiment.
Figure 17:
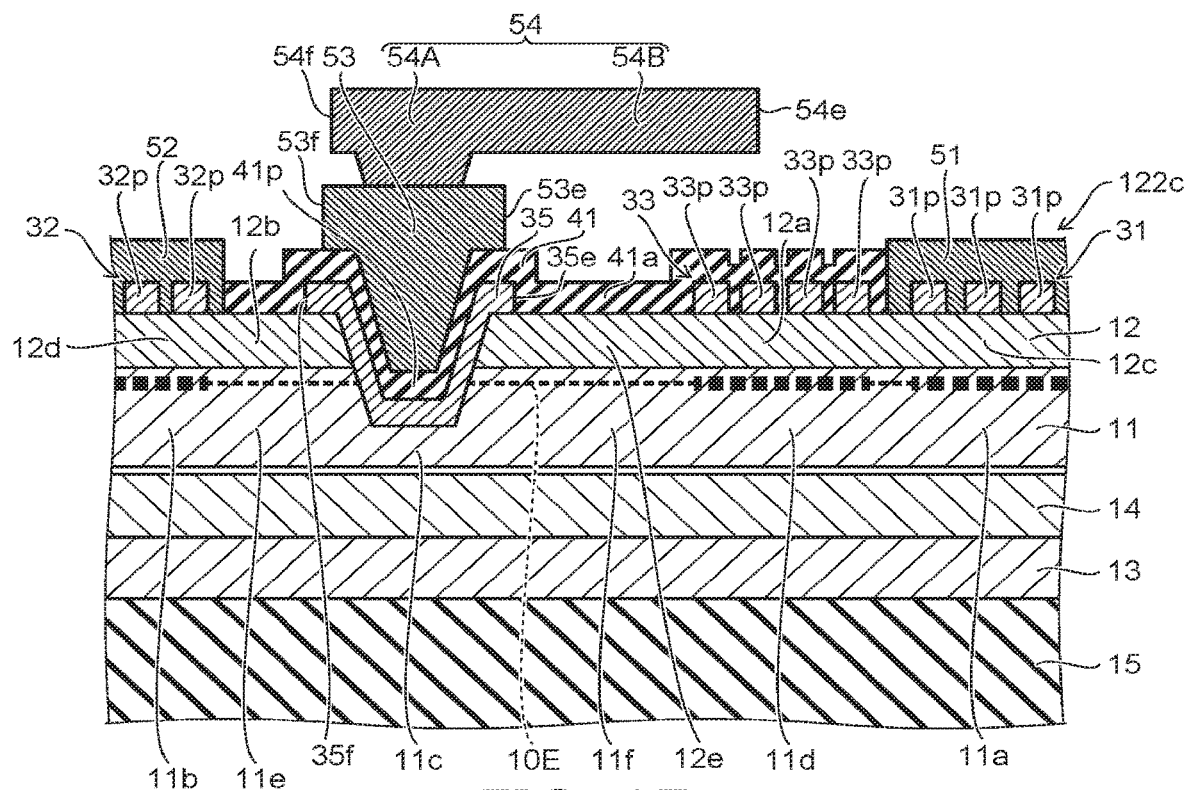
FIG. 17 is a schematic cross-sectional view illustrating a semiconductor device according to the embodiment.
Figure 18:
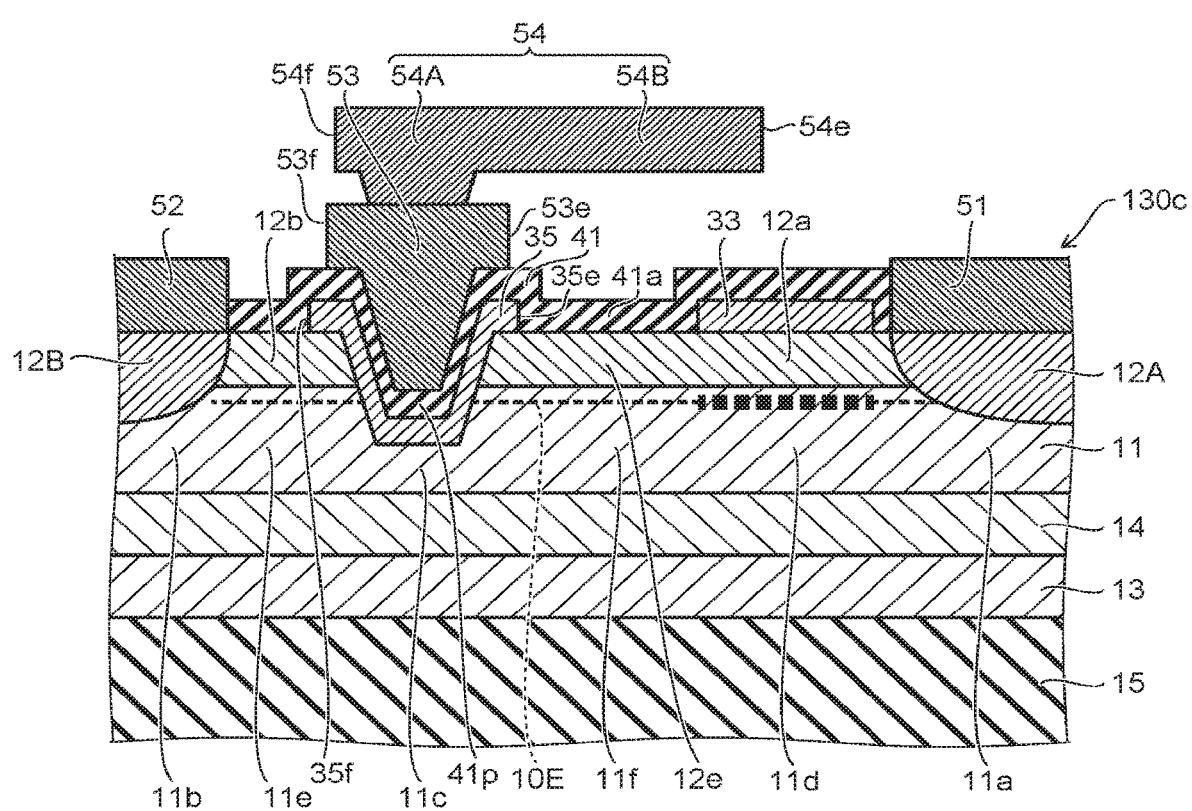
FIG. 18 is a schematic cross-sectional view illustrating a semiconductor device according to the embodiment.
Figure 19:
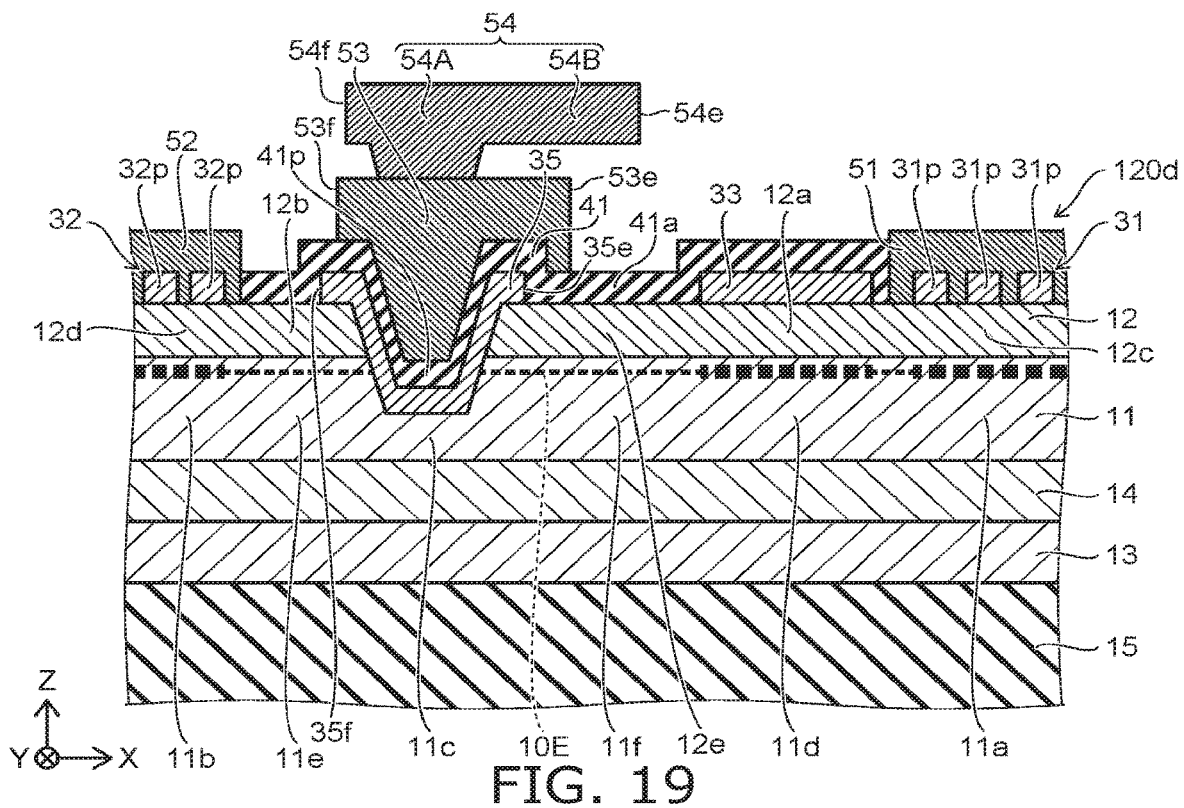
FIG. 19 is a schematic cross-sectional view illustrating a semiconductor device according to the embodiment.
Figure 20:
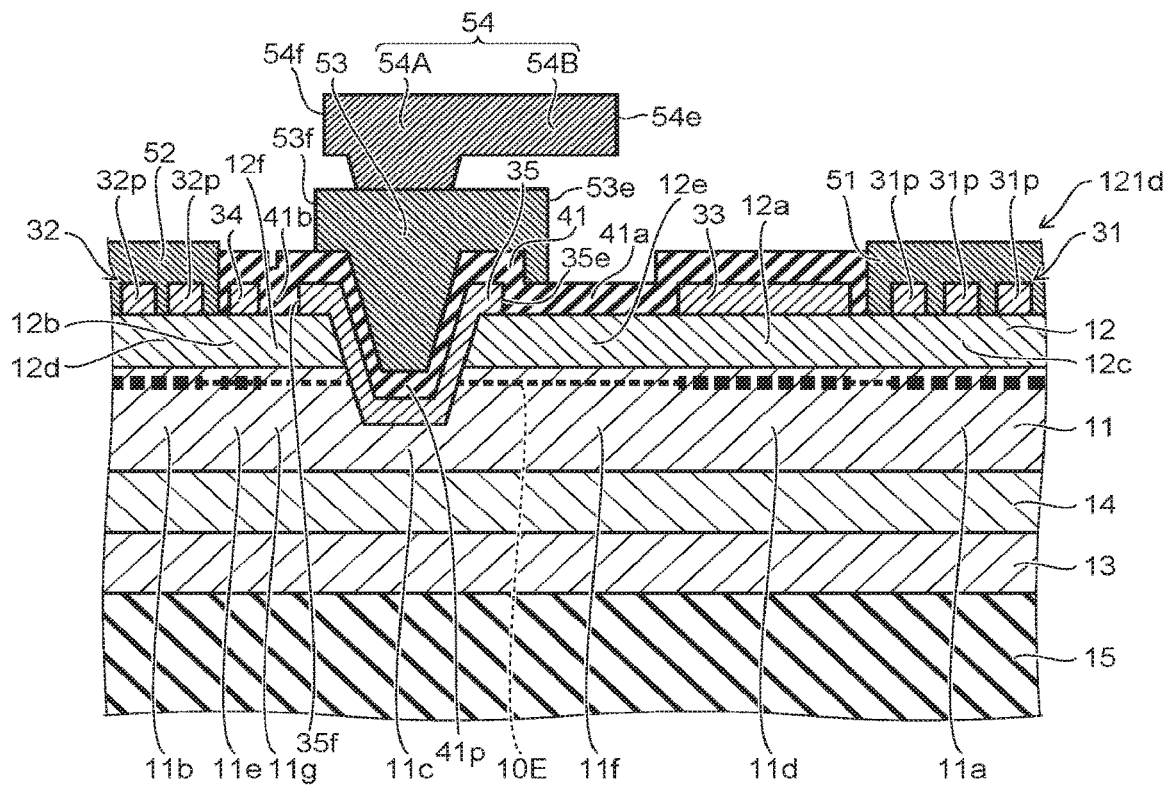
FIG. 20 is a schematic cross-sectional view illustrating a semiconductor device according to the embodiment.
Figure 21:
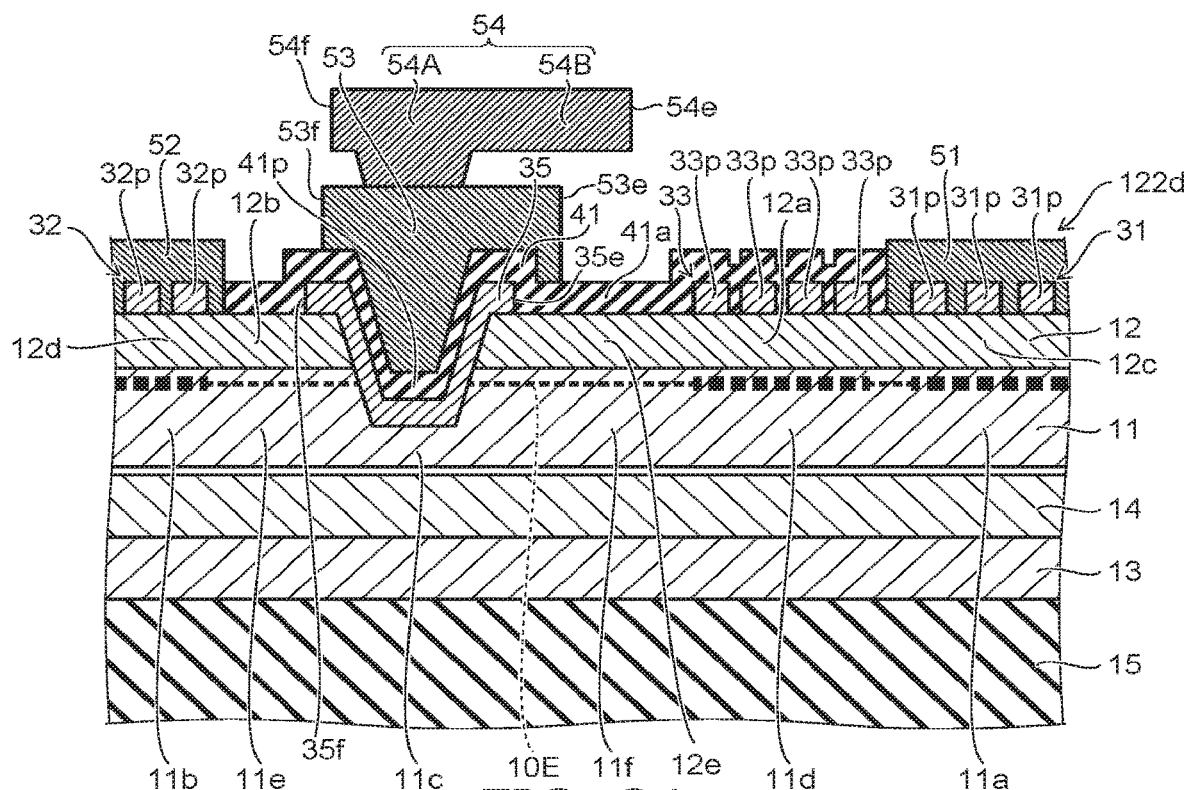
FIG. 21 is a schematic cross-sectional view illustrating a semiconductor device according to the embodiment.
Figure 22:
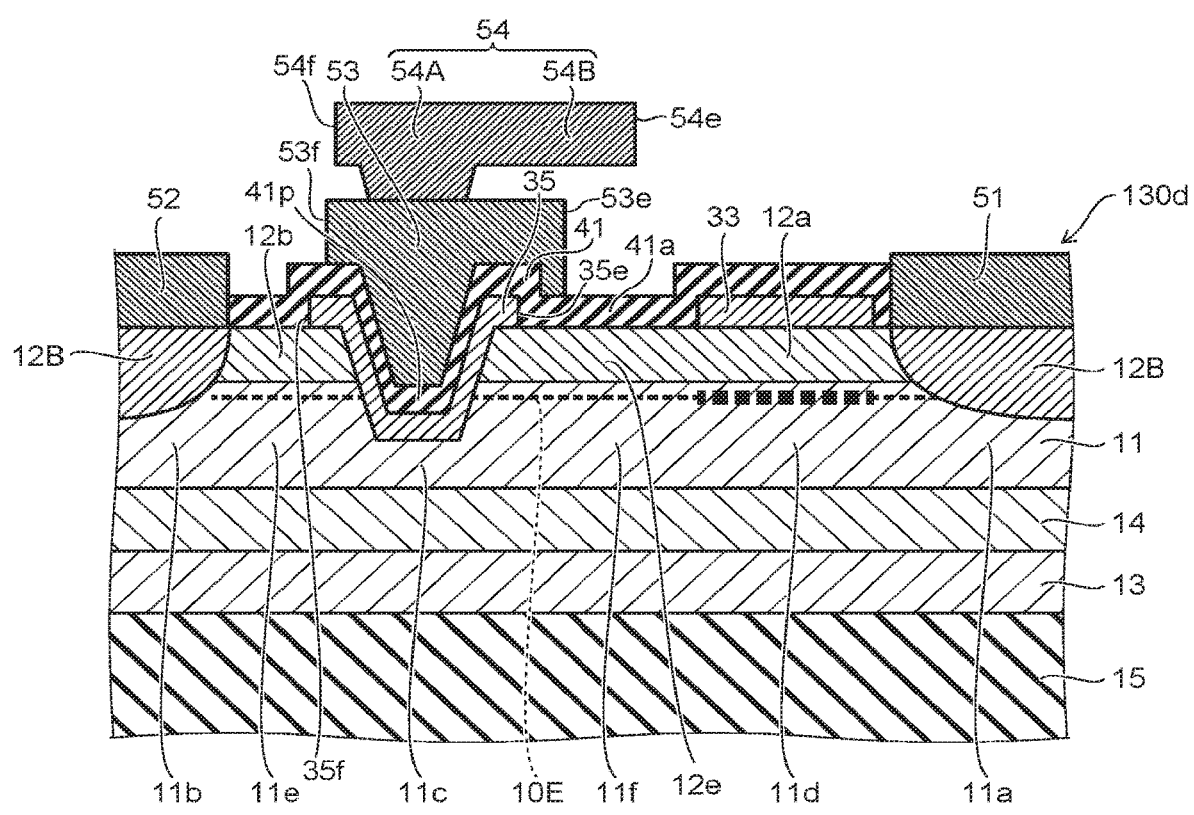
FIG. 22 is a schematic cross-sectional view illustrating a semiconductor device according to the embodiment.
Figure 23:
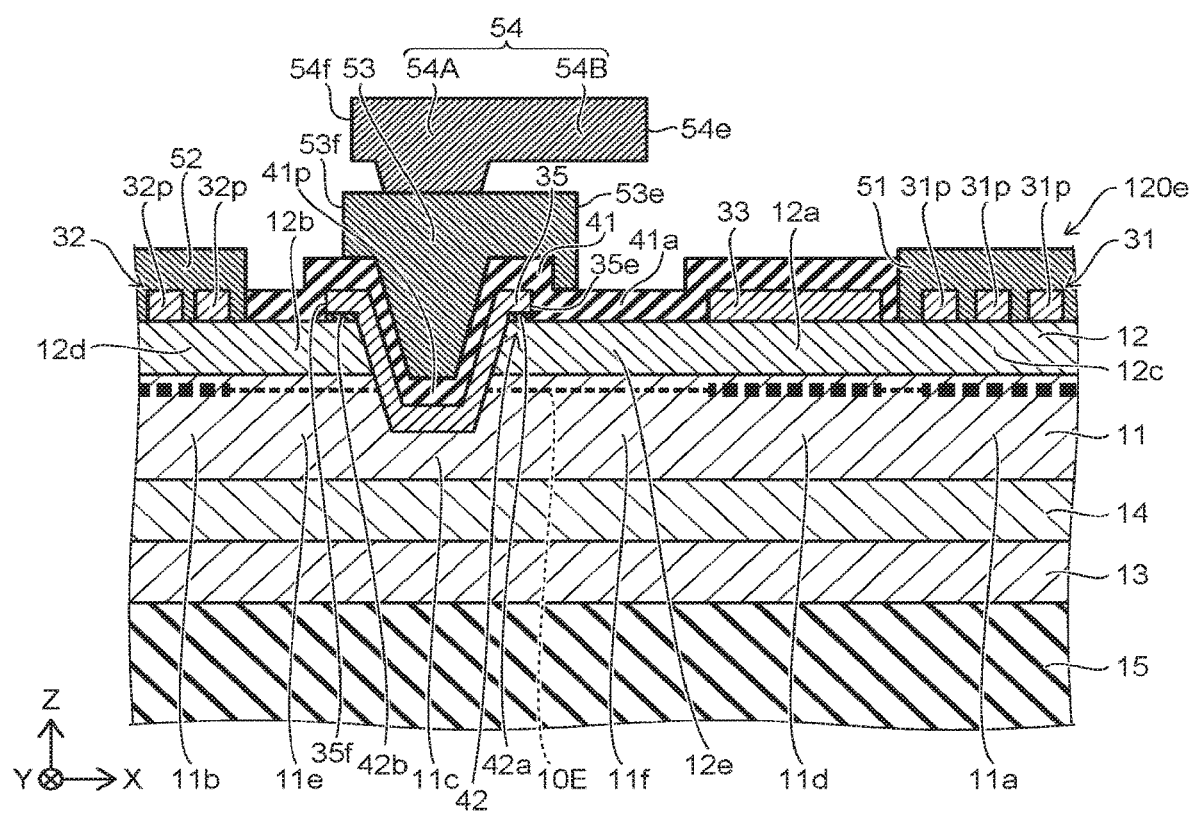
FIG. 23 is a schematic cross-sectional view illustrating a semiconductor device according to the embodiment.
Figure 24:
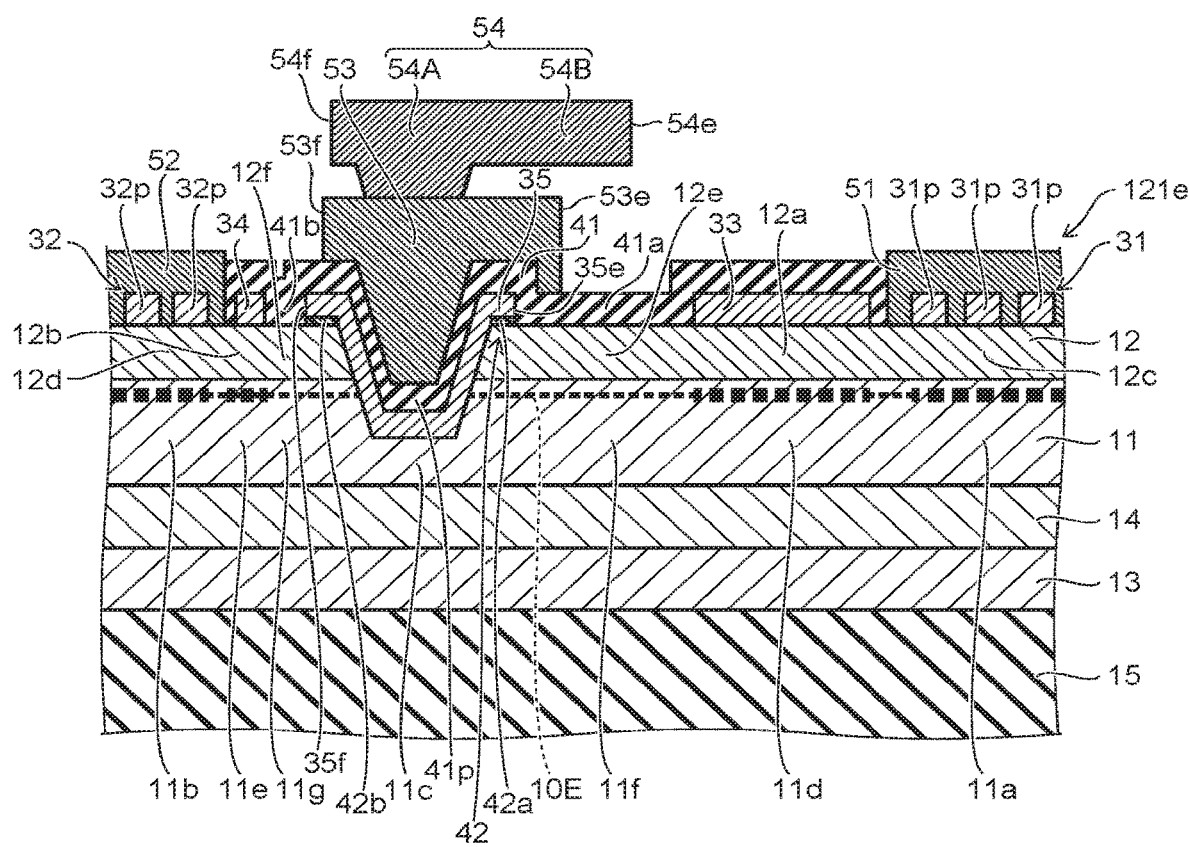
FIG. 24 is a schematic cross-sectional view illustrating a semiconductor device according to the embodiment.
Figure 25:
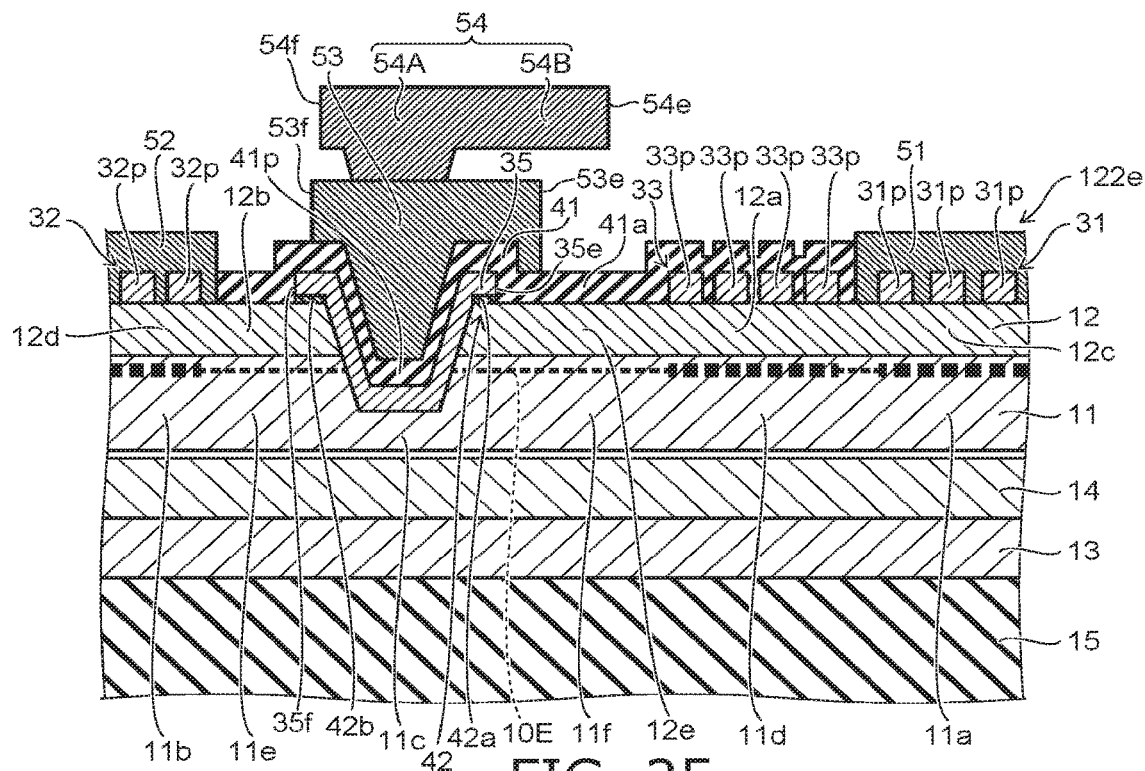
FIG. 25 is a schematic cross-sectional view illustrating a semiconductor device according to the embodiment.
Figure 26:
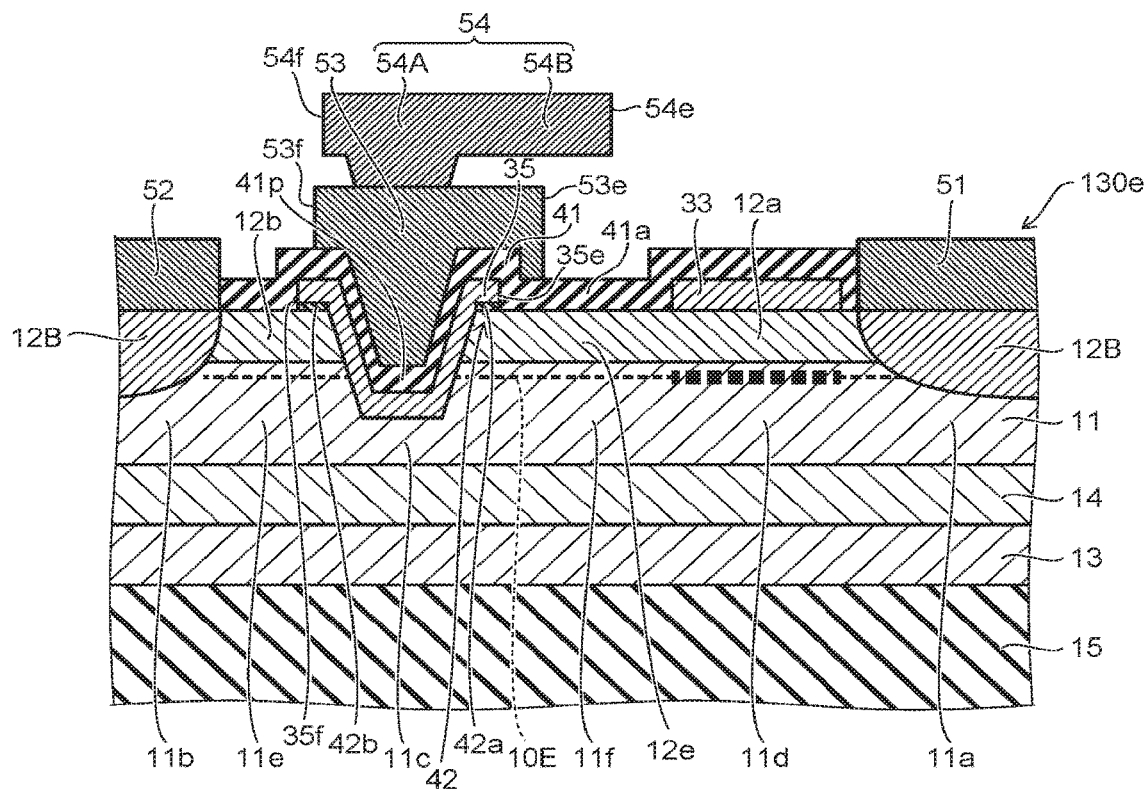
FIG. 26 is a schematic cross-sectional view illustrating a semiconductor device according to the embodiment.
Figure 27:
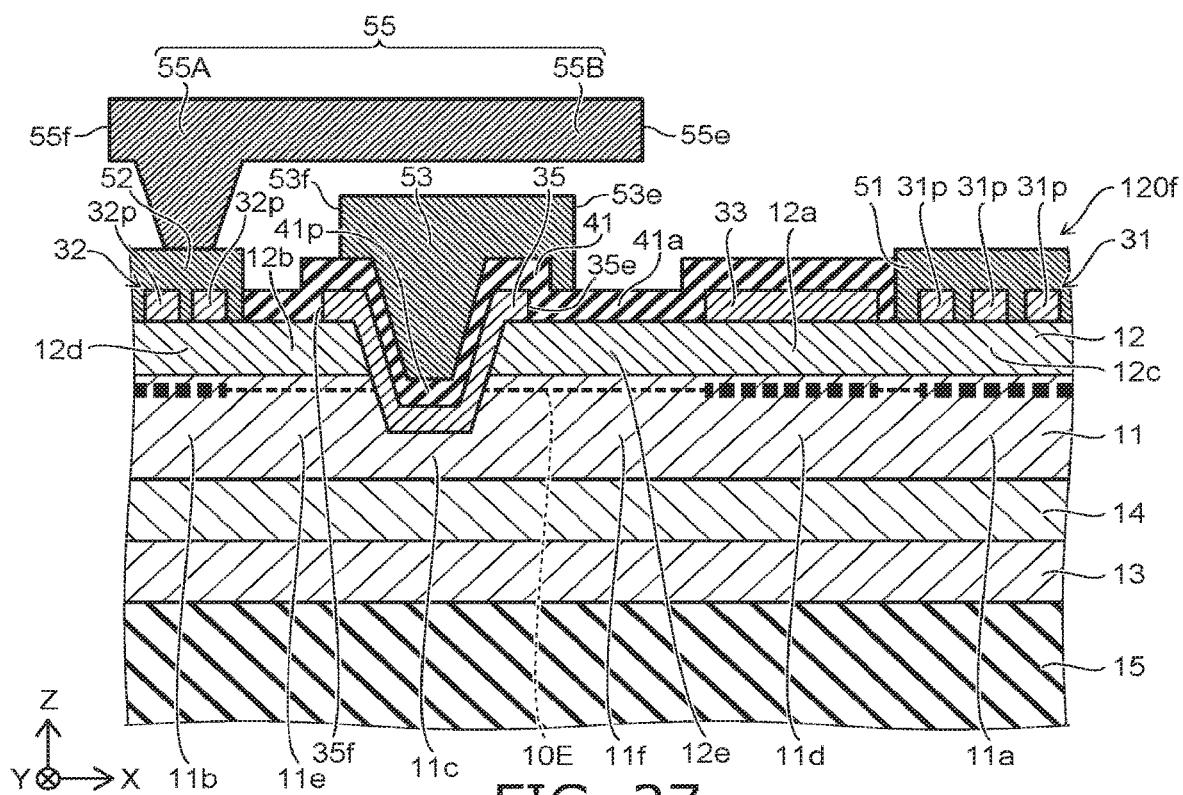
FIG. 27 is a schematic cross-sectional view illustrating a semiconductor device according to the embodiment.
Figure 28:
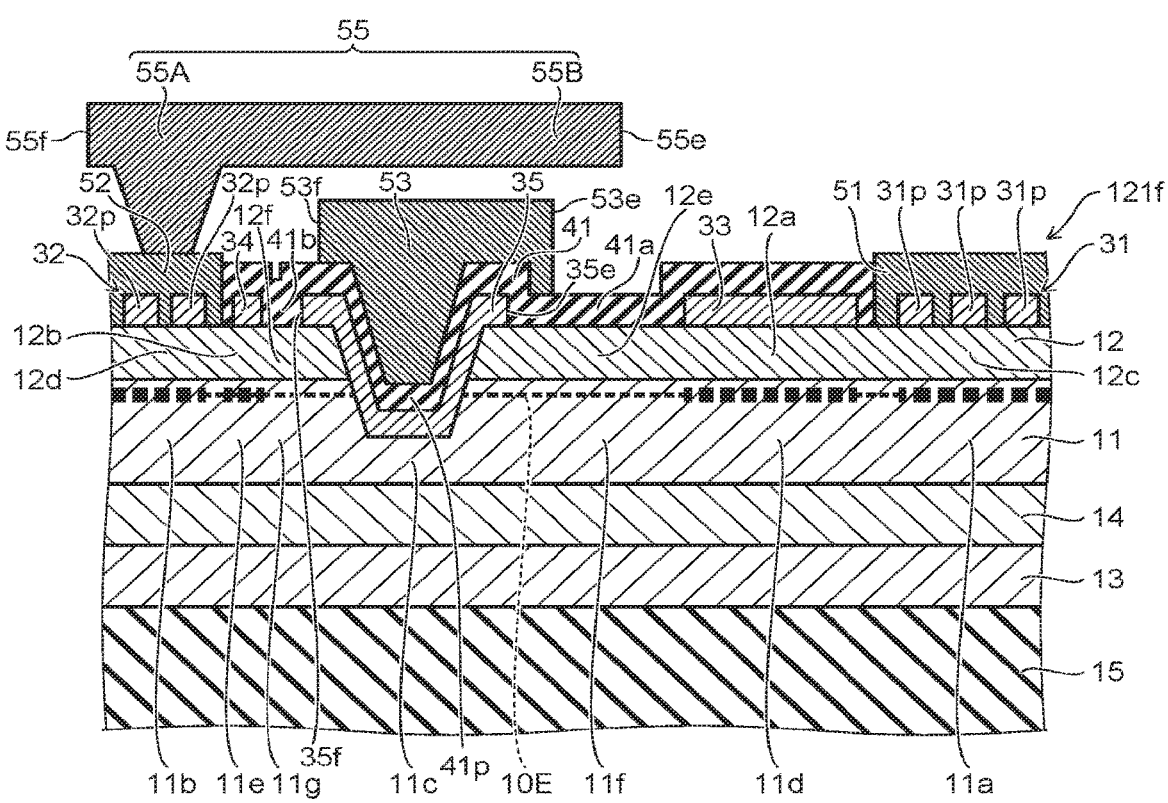
FIG. 28 is a schematic cross-sectional view illustrating a semiconductor device according to the embodiment.
Figure 29:
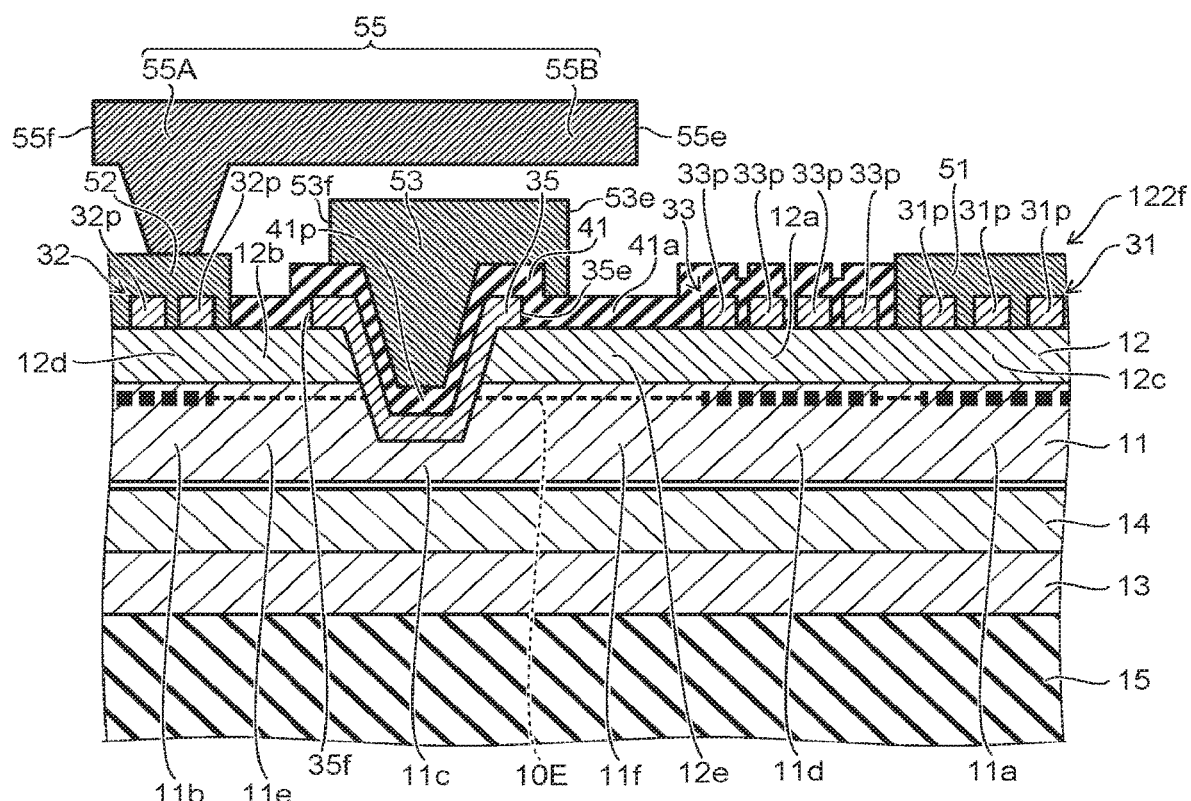
FIG. 29 is a schematic cross-sectional view illustrating a semiconductor device according to the embodiment.
Figure 30:
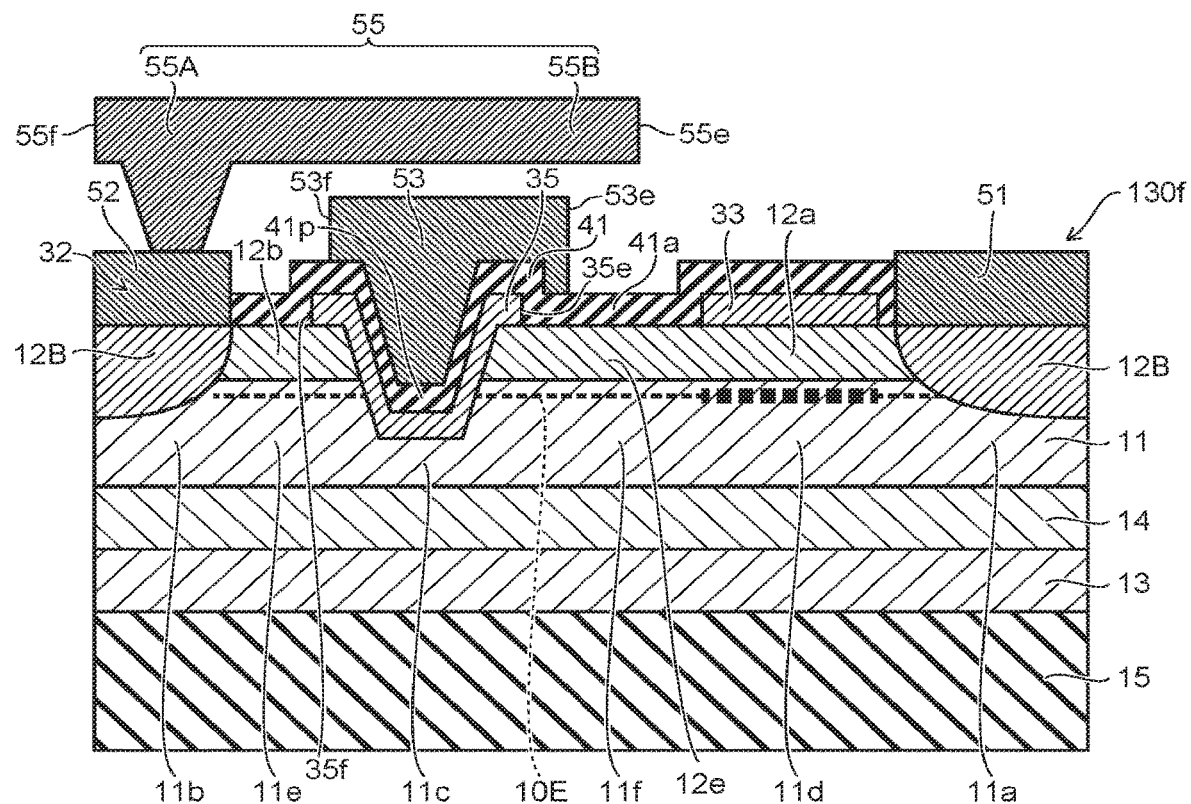
FIG. 30 is a schematic cross-sectional view illustrating a semiconductor device according to the embodiment.

FIG. 6 is a schematic cross-sectional view illustrating a semiconductor device according to a third embodiment.

As shown in FIG. 6, the semiconductor device 130 according to the embodiment includes the first electrode 51, the second electrode 52, the third electrode 53, the first semiconductor layer 11, the second semiconductor layer 12, the third compound member 33 (a compound member), and the first insulating layer 41.

The position of the third electrode 53 in the first direction (e.g., the X-axis direction) from the second electrode 52 toward the first electrode 51 is between the position of the second electrode 52 in the first direction and the position of the first electrode 51 in the first direction.

The first semiconductor layer 11 includes $Al_{x1}Ga_{1-x1}N$ ($0≤x1<1$). The first semiconductor layer 11 includes the first to sixth partial regions 11a to 11f. The second direction (e.g., the Z-axis direction) from the first partial region 11a toward the first electrode 51 crosses the first direction. The direction from the second partial region 11b toward the second electrode 52 is aligned with the second direction. The direction from the third partial region 11c toward the third electrode 53 is aligned with the second direction. The fourth partial region 11d is between the third partial region 11c and the first partial region 11a in the first direction. The fifth partial region 11e is between the second partial region 11b and the third partial region 11c in the first direction. The sixth partial region 11f is between the third partial region 11c and the fourth partial region 11d in the first direction.

The second semiconductor layer 12 includes $Al_{x2}Ga_{1-x2}N$ ($0<x2<1$ and $x1<x2$). The second semiconductor layer 12 includes the first semiconductor region 12a and the second semiconductor region 12b. The direction from the fourth partial region 11d toward the first semiconductor region 12a is aligned with the second direction (e.g., the Z-axis direction). The direction from the fifth partial region 11e toward the second semiconductor region 12b is aligned with the second direction. The third compound member 33 (the compound member) includes $Al_{y3}Ga_{1-y3}N$ ($0<y3≤1$ and $x2<y3$). The direction from the fourth partial region 11d toward the third compound member 33 is aligned with the second direction (the Z-axis direction).

The first insulating layer 41 includes the first insulating region 41a. A portion of the first semiconductor region 12a is between the fourth partial region 11d and the third compound member 33 in the second direction (the Z-axis direction). Another portion of the first semiconductor region 12a is between the sixth partial region 11f and the first insulating region 41a in the second direction (the Z-axis direction).

The carrier concentration is high locally in the portion positioned under the third compound member 33. The concentration of the electric field between the third electrode 53 and the first electrode 51 can be relaxed thereby. Thereby, for example, the breakdown voltage can be increased. According to the third embodiment, a semiconductor device can be provided in which the characteristics can be improved.

For example, the third compound member 33 contacts a portion of the first semiconductor region 12a. For example, the first insulating region 41a contacts another portion of the first semiconductor region 12a.

In the semiconductor device 130, a first doped region 12A may be provided between the first electrode 51 and the first partial region 11a. A second doped region 12B may be provided between the second electrode 52 and the second partial region 11b. The concentrations of the impurities in these doped regions are higher than the concentration of the impurity in the first semiconductor layer 11. The impurities include, for example, at least one selected from the group consisting of Si, Ge, C, and Ti. A low resistance of the electrical connection between the semiconductor layer and the electrode is obtained by these doped regions. The first compound member 31 or the second compound member 32 may be omitted in the case where these doped regions are provided. These doped regions may be portions of the second semiconductor layer 12. These doped regions substantially may include $Al_{x2}Ga_{1-x2}N$ ($0<x2<1$ and $x1<x2$). At least a portion of the doped regions includes $Al_{x2}Ga_{1-x2}N$ (a $0<x2<1$ and $x1<x2$) and an impurity.

In the semiconductor devices 120, 121, 122, and 130, the position of the end portion 35e in the X-axis direction is between the position of the end portion 53e in the X-axis direction and the position of the third compound member 33 in the X-axis direction. The end portion 53e of the third electrode 53 is distal to the first electrode 51; therefore, for example, shorts, etc., are suppressed; and a high breakdown voltage is obtained.

FIG. 7 to FIG. 10 are schematic cross-sectional views illustrating semiconductor devices according to the embodiment.

In the semiconductor devices 120a, 121a, 122a, and 130a as shown in FIG. 7 to FIG. 10, the position of the end portion 53e in the X-axis direction is between the position of the end portion 35e in the X-axis direction and the position of the third compound member 33 in the X-axis direction. Otherwise, the configurations of the semiconductor devices 120a, 121a, 122a, and 130a are similar to the configurations of the semiconductor devices 120, 121, 122, and 130.

In the semiconductor devices 120a, 121a, 122a, and 130a, for example, the end portion 53e of the third electrode 53 may function as a field plate. The concentration of the electric field is relaxed. For example, a high breakdown voltage is obtained.

FIG. 11 to FIG. 14 are schematic cross-sectional views illustrating semiconductor devices according to the embodiment.

As shown in FIG. 11 to FIG. 14, the semiconductor devices 120b, 121b, 122b, and 130b include a conductive member 54. Otherwise, the configurations of the semiconductor devices 120b, 121b, 122b, and 130b are similar to the configurations of the semiconductor devices 120, 121, 122, and 130.

The conductive member 54 is electrically connected to the third electrode 53. The conductive member 54 includes a first conductive portion 54A and a second conductive portion 54B. The third electrode 53 is between the third partial region 11c and the first conductive portion 54A in the second direction (the Z-axis direction). The second conductive portion 54B is connected to the first conductive portion 54A. The direction from the first conductive portion 54A toward the second conductive portion 54B is aligned with the first direction (the X-axis direction).

The conductive member 54 may function as a field plate. The concentration of the electric field is relaxed by the conductive member 54. For example, a high breakdown voltage is obtained.

The conductive member 54 includes an end portion 54e. The end portion 54e is the end portion on the first electrode 51 side. The direction from another end portion 54f of the conductive member 54 toward the end portion 54e is aligned with the X-axis direction.

The position of the end portion 54e in the X-axis direction is between the position of the third electrode 53 in the X-axis direction and the position of the first electrode 51 in the X-axis direction. The position of the end portion 54e in the X-axis direction is between the position of the end portion 53e in the X-axis direction and the position of the first electrode 51 in the X-axis direction.

In the semiconductor devices 120b, 121b, 122b, and 130b, the position of the third compound member 33 in the X-axis direction is between the position of the end portion 54e in the X-axis direction and the position of the first electrode 51 in the X-axis direction.

FIG. 15 to FIG. 18 are schematic cross-sectional views illustrating semiconductor devices according to the embodiment.

As shown in FIG. 15 to FIG. 18, the position of the end portion 54e of the conductive member 54 in the semiconductor devices 120c, 121c, 122c, and 130c is different from that of the semiconductor devices 120b, 121b, 122b, and 130b. Otherwise, the configurations of the semiconductor devices 120c, 121c, 122c, and 130c are similar to the configurations of the semiconductor devices 120b, 121b, 122b, and 130b.

In the semiconductor devices 120c, 121c, 122c, and 130c, the end portion 54e overlaps the third compound member 33 in the second direction (the Z-axis direction). In the semiconductor devices 120c, 121c, 122c, and 130c, at least a portion of the third compound member 33 is between the second conductive portion 54B and the second semiconductor layer 12 in the second direction (the Z-axis direction). For example, at least a portion of the third compound member 33 is covered with the second conductive portion 54B. For example, the on-resistance can be low.

FIG. 19 to FIG. 22 are schematic cross-sectional views illustrating semiconductor devices according to the embodiment.

In the semiconductor devices 120d, 121d, 122d, and 130d as shown in FIG. 19 to FIG. 22, the position of the end portion 53e in the X-axis direction is between the position of the end portion 35e in the X-axis direction and the position of the third compound member 33 in the X-axis direction. Otherwise, the configurations of the semiconductor devices 120d, 121d, 122d, and 130d are similar to the configurations of the semiconductor devices 120b, 121b, 122b, and 130b. For example, the reliability can be improved further by the relationships of the positions of the end portion 53e, the end portion 35e, and the third compound member 33 such as those recited above.

FIG. 23 to FIG. 26 are schematic cross-sectional views illustrating semiconductor devices according to the embodiment.

As shown in FIG. 23 to FIG. 26, the semiconductor devices 120e, 121e, 122e, and 130e include a second insulating layer 42. Otherwise, the configurations of the semiconductor devices 120e, 121e, 122e, and 130e are similar to the configurations of the semiconductor devices 120d, 121d, 122d, and 130d.

The second insulating layer 42 includes, for example, a first insulating portion 42a and a second insulating portion 42b. The first insulating portion 42a is between a portion (e.g., the fifth semiconductor region 12e) of the second semiconductor layer 12 and a portion of the fifth compound member 35 in the Z-axis direction. Due to the first insulating portion 42a, the carrier region 10E is not formed easily at the portion under the first insulating portion 42a. For example, the concentration of the electric field can be relaxed more. For example, the threshold voltage can be increased moderately. For example, a normally-on operation is obtained easily.

The second insulating portion 42b is between a portion (e.g., the second semiconductor region 12b) of the second semiconductor layer 12 and a portion of the fifth compound member 35 in the Z-axis direction. Due to the second insulating portion 42b, the carrier region 10E is not formed easily at the portion under the second insulating portion 42b. For example, the concentration of the electric field can be relaxed more. For example, the threshold voltage can be increased moderately. For example, a normally-on operation is obtained easily.

The second insulating layer 42 includes, for example, SiN. The concentration of nitrogen in the second insulating layer 42 is higher than the concentration of nitrogen in the first insulating layer 41. The concentration of oxygen in the first insulating layer 41 is higher than the concentration of oxygen in the second insulating layer 42.

FIG. 27 to FIG. 30 are schematic cross-sectional views illustrating semiconductor devices according to the embodiment.

As shown in FIG. 27 to FIG. 30, the semiconductor devices 120f, 121f, 122f, and 130f include a conductive member 55. Otherwise, the configurations of the semiconductor devices 120f, 121f, 122f, and 130f are similar to the configurations of the semiconductor devices 120a, 121a, 122a, and 130a.

The conductive member 55 is electrically connected to the second electrode 52. The conductive member 55 includes a third conductive portion 55A and a fourth conductive portion 55B. The second electrode 52 is between the second partial region 11b and the third conductive portion 55A in the second direction (the Z-axis direction). The fourth conductive portion 55B is connected to the third conductive portion 55A. The direction from the third conductive portion 55A toward the fourth conductive portion 55B is aligned with the first direction (the X-axis direction).

The conductive member 55 may function as a field plate. The concentration of the electric field is relaxed by the conductive member 55. For example, a high breakdown voltage is obtained.

The conductive member 55 includes an end portion 55e. The end portion 55e is the end portion on the first electrode 51 side. The direction from another end portion 55f of the conductive member 55 toward the end portion 55e is aligned with the X-axis direction.

The position of the end portion 55e in the X-axis direction is between the position of the third electrode 53 in the X-axis direction and the position of the first electrode 51 in the X-axis direction. The position of the end portion 55e in the X-axis direction is between the position of the end portion 53e in the X-axis direction and the position of the first electrode 51 in the X-axis direction.

In the embodiment, the first to third electrodes 51 to 53 include, for example, Ti, etc. The conductive members 54 and 55 include, for example, at least one selected from the group consisting of Ti and Al, etc. The first insulating layer 41 includes, for example, at least one selected from the group consisting of silicon oxide, silicon nitride, silicon oxynitride, and aluminum oxide. The second insulating layer 42 includes, for example, at least one selected from the group consisting of silicon nitride and silicon oxynitride.

According to the embodiments, a semiconductor device can be provided in which the characteristics can be improved.

In the specification, "nitride semiconductor" includes all compositions of semiconductors of the chemical formula $B_x In_y Al_z Ga_{1-x-y-z} N$ ($0 \le x \le 1$, $0 \le y \le 1$, $0 \le z \le 1$, and $x+y+z \le 1$) for which the composition ratios x, y, and z are changed within the ranges respectively. "Nitride semiconductor" further includes Group V elements other than N (nitrogen) in the chemical formula recited above, various elements added to control various properties such as the conductivity type and the like, and various elements included unintentionally.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in semiconductor devices such as semiconductor layers, electrodes, insulating layers, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all semiconductor devices practicable by an appropriate design modification by one skilled in the art based on the semiconductor devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
   a first electrode;
   a second electrode;
   a third electrode, a position of the third electrode in a first direction being between a position of the second electrode in the first direction and a position of the first electrode in the first direction, the first direction being from the second electrode toward the first electrode;
   a first semiconductor layer including $Al_{x1}Ga_{1-x1}N$ ($0 \le x1 < 1$), the first semiconductor layer including a first partial region, a second partial region, a third partial region, a fourth partial region, and a fifth partial region, a second direction from the first partial region toward the first electrode crossing the first direction, a direction from the second partial region toward the second electrode being aligned with the second direction, a direction from the third partial region toward the third electrode being aligned with the second direction, the fourth partial region being between the third partial region and the first partial region in the first direction, the fifth partial region being between the second partial region and the third partial region in the first direction;
   a second semiconductor layer including $Al_{x2}Ga_{1-x2}N$ ($0 < x2 < 1$ and $x1 < x2$), the second semiconductor layer including a first semiconductor region, a second semiconductor region, and a third semiconductor region, a direction from the fourth partial region toward the first semiconductor region being aligned with the second direction, a direction from the fifth partial region toward the second semiconductor region being aligned with the second direction, the third semiconductor region being between the first partial region and the first electrode in the second direction, a portion of the third electrode being provided between the second semiconductor region and the third semiconductor region in the first direction;
   a first compound member including $Al_{y1}Ga_{1-y1}N$ ($0 < y1 \le 1$ and $x2 < y1$) and including a plurality of first compound portions, the plurality of first compound portions being between the third semiconductor region and the first electrode in the second direction, a portion of the first electrode being between one of the plurality of first compound portions and another one of the plurality of first compound portions in the first direction, the third electrode not overlapping the first compound member in the second direction; and
   a first insulating layer, a first portion of the first insulating layer being provided (1) between the third partial region and the portion of the third electrode in the second direction, and (2) between the fourth partial region and the fifth partial region in the first direction, the first insulating layer continuously extending from the third electrode to the first electrode, and the entire continuous extension of the first insulating layer from the third electrode to the first electrode directly contacting the second semiconductor layer.

2. The semiconductor device according to claim 1, wherein a direction from the one of the plurality of first compound portions toward the other one of the plurality of first compound portions has a component in the first direction.

3. The semiconductor device according to claim 1, wherein a direction from the one of the plurality of first compound portions toward the other one of the plurality of first compound portions has a component in a third direction, the third direction crossing a plane including the first direction and the second direction.

4. The semiconductor device according to claim 1, wherein the one of the plurality of first compound portions and the other one of the plurality of first compound portions contact the third semiconductor region.

5. The semiconductor device according to claim 1, wherein a bottom face of the first electrode that faces in a direction parallel to the second direction directly contacts the third semiconductor region.

6. The semiconductor device according to claim 1, further comprising a second compound member including $Al_{y2}Ga_{1-y2}N$ ($0 < y2 \le 1$ and $x2 < y2$),
   the second semiconductor layer further including a fourth semiconductor region,
   the fourth semiconductor region being between the second partial region and the second electrode in the second direction,
   the second compound member including a plurality of second compound portions, the plurality of second compound portions being between the fourth semiconductor region and the second electrode, a portion of the second electrode being between one of the plurality of second compound portions and another one of the plurality of second compound portions.

7. The semiconductor device according to claim 6, wherein a direction from the one of the plurality of second compound portions toward the other one of the plurality of second compound portions has a component in the first direction.

8. The semiconductor device according to claim 6, wherein a direction from the one of the plurality of second compound portions toward the other one of the plurality of second compound portions has a component in a third direction, the third direction crossing a plane including the first direction and the second direction.

9. The semiconductor device according to claim 6, wherein the one of the plurality of second compound portions and the other one of the plurality of second compound portions contact the fourth semiconductor region.

10. The semiconductor device according to claim 6, wherein the portion of the second electrode contacts the fourth semiconductor region.

11. The semiconductor device according to claim 1, further comprising a fifth compound member including $Al_{y5}Ga_{1-y5}N$ ($0 < y5 \le 1$ and $x2 < y5$),
    a portion of the second semiconductor layer being between the first semiconductor layer and at least a portion of the fifth compound member.

12. The semiconductor device according to claim 11, wherein another portion of the fifth compound member is between the third electrode and the first semiconductor layer.

13. The semiconductor device according to claim 1, wherein the first direction is parallel to an interface between the first semiconductor layer and the second semiconductor layer.

14. The semiconductor device according to claim 1, wherein the first compound member is not provided between the first semiconductor region and the second portion of the first insulating layer.

15. A semiconductor device, comprising:
    a first electrode;
    a second electrode;

a third electrode, a position of the third electrode in a first direction being between a position of the second electrode in the first direction and a position of the first electrode in the first direction, the first direction being from the second electrode toward the first electrode;

a first semiconductor layer including $Al_{x1}Ga_{1-x1}N$ ($0 \le x1 < 1$), the first semiconductor layer including a first partial region, a second partial region, a third partial region, a fourth partial region, and a fifth partial region, a second direction from the first partial region toward the first electrode crossing the first direction, a direction from the second partial region toward the second electrode being aligned with the second direction, a direction from the third partial region toward the third electrode being aligned with the second direction, the fourth partial region being between the third partial region and the first partial region in the first direction, the fifth partial region being between the second partial region and the third partial region in the first direction;

a second semiconductor layer including $Al_{x2}Ga_{1-x2}N$ ($0 < x2 < 1$ and $x1 < x2$), the second semiconductor layer including a first semiconductor region, a second semiconductor region, and a third semiconductor region, a direction from the fourth partial region toward the first semiconductor region being aligned with the second direction, a direction from the fifth partial region toward the second semiconductor region being aligned with the second direction, the third semiconductor region being between the first partial region and the first electrode in the second direction, a portion of the third electrode being provided between the second semiconductor region and the third semiconductor region in the first direction;

a first compound member including $Al_{y1}Ga_{1-y1}N$ ($0 < y1 \le 1$ and $x2 < y1$) and including a plurality of first compound portions, the plurality of first compound portions being between the third semiconductor region and the first electrode in the second direction, a portion of the first electrode being between one of the plurality of first compound portions and another one of the plurality of first compound portions in the first direction, the third electrode not overlapping the first compound member in the second direction; and a first insulating layer, a portion of the first insulating layer being provided (1) between the third partial region and the portion of the third electrode in the second direction, and (2) between the fourth partial region and the fifth partial region in the first direction, the first insulating layer being continuous between the third electrode and the first electrode in the first direction, and the first compound member being not provided between the first semiconductor region and the first insulating layer in the second direction.

16. A semiconductor device, comprising:
a first electrode;
a second electrode;
a third electrode, a position of the third electrode in a first direction being between a position of the second electrode in the first direction and a position of the first electrode in the first direction, the first direction being from the second electrode toward the first electrode;
a first semiconductor layer including $Al_{x1}Ga_{1-x1}N$ ($0 \le x1 < 1$), the first semiconductor layer including a first partial region, a second partial region, a third partial region, a fourth partial region, and a fifth partial region, a second direction from the first partial region toward the first electrode crossing the first direction, a direction from the second partial region toward the second electrode being aligned with the second direction, a direction from the third partial region toward the third electrode being aligned with the second direction, the fourth partial region being between the third partial region and the first partial region in the first direction, the fifth partial region being between the second partial region and the third partial region in the first direction;

a second semiconductor layer including $Al_{x2}Ga_{1-x2}N$ ($0 < x2 < 1$ and $x1 < x2$), the second semiconductor layer including a first semiconductor region, a second semiconductor region, and a third semiconductor region, a direction from the fourth partial region toward the first semiconductor region being aligned with the second direction, a direction from the fifth partial region toward the second semiconductor region being aligned with the second direction, the third semiconductor region being between the first partial region and the first electrode in the second direction, a portion of the third electrode being provided between the second semiconductor region and the third semiconductor region in the first direction;

a first compound member including $Al_{y1}Ga_{1-y1}N$ ($0 < y1 \le 1$ and $x2 < y1$) and including a plurality of first compound portions, the plurality of first compound portions being between the third semiconductor region and the first electrode in the second direction, a portion of the first electrode being between one of the plurality of first compound portions and another one of the plurality of first compound portions in the first direction, the third electrode not overlapping the first compound member in the second direction;

a first insulating layer, a first portion of the first insulating layer being provided between the third partial region and the portion of the third electrode in the second direction, a second portion of the first insulating layer being provided between the second semiconductor region and the portion of the third electrode in the first direction, and a third portion of the first insulating layer being provided between the portion of the third electrode and the first semiconductor region in the first direction; and a fifth compound member including the $Al_{y1}Ga_{1-y1}N$, the fifth compound member being continuously provided at least (1) between the third partial region and the first portion of the first insulating layer in the second direction, (2) between the second semiconductor region and the second portion of the first insulating layer in the first direction, and (3) between the third portion of the first insulating layer and the first semiconductor region in the first direction.

17. The semiconductor device according to claim 16, wherein the first insulating layer includes at least one selected from the group consisting of silicon oxide, silicon nitride, silicon oxynitride, and aluminum oxide.

18. The semiconductor device according to claim 16, wherein a material of the first insulating layer is different from a material of the first compound member.

* * * * *